United States Patent
Yamada

(10) Patent No.: US 11,688,480 B2
(45) Date of Patent: Jun. 27, 2023

(54) SEMICONDUCTOR STORAGE DEVICE

(71) Applicant: Socionext Inc., Kanagawa (JP)

(72) Inventor: Tomoyuki Yamada, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 57 days.

(21) Appl. No.: 17/560,980

(22) Filed: Dec. 23, 2021

(65) Prior Publication Data

US 2022/0115080 A1  Apr. 14, 2022

Related U.S. Application Data

(63) Continuation of application No. PCT/JP2020/024197, filed on Jun. 19, 2020.

(30) Foreign Application Priority Data

Jun. 28, 2019 (JP) ................................ 2019-121747

(51) Int. Cl.
  *G11C 17/12* (2006.01)
  *H10B 20/00* (2023.01)
(52) U.S. Cl.
  CPC ............. *G11C 17/12* (2013.01); *H10B 20/65* (2023.02)
(58) Field of Classification Search
  CPC ..... G11C 17/12; G11C 17/16; G11C 27/0207; H10B 20/65; H10B 20/20; H10B 20/34
  USPC .............................................. 365/95, 189.05
  See application file for complete search history.

(56) References Cited

U.S. PATENT DOCUMENTS

| 7,402,855 | B2 | 7/2008 | Kurjanowicz | |
|---|---|---|---|---|
| 7,715,246 | B1 | 5/2010 | Kim | |
| 9,502,110 | B1* | 11/2016 | Tailliet | G11C 11/419 |
| 10,134,744 | B1* | 11/2018 | Chen | H10B 10/00 |
| 10,431,321 | B1* | 10/2019 | Yoo | G11C 29/50 |
| 2003/0103382 | A1* | 6/2003 | Kobayashi | H10B 41/49 |
| | | | | 365/185.27 |
| 2008/0074915 | A1* | 3/2008 | Terzioglu | G11C 17/16 |
| | | | | 365/96 |
| 2011/0044112 | A1 | 2/2011 | Torii | |

(Continued)

FOREIGN PATENT DOCUMENTS

| JP | 2011-077159 A | 4/2011 |
|---|---|---|
| JP | 2012-009669 A | 1/2012 |

(Continued)

OTHER PUBLICATIONS

International Search Report issued in International Patent Application No. PCT/JP2020/024197, dated Aug. 25, 2020; with English translation.

(Continued)

*Primary Examiner* — Michael T Tran
(74) *Attorney, Agent, or Firm* — McDermott Will & Emery LLP

(57) ABSTRACT

A layout structure of a small-area one time programmable (OTP) memory using a complementary FET (CFET) is provided. The OTP memory has transistors TP as a program element and transistors TS as a switch element. The transistors TP are three-dimensional transistors of which channel portions overlap each other as viewed in plan. The transistors TS are three-dimensional transistors of which channel portions overlap each other as viewed in plan. The OTP memory of two bits is implemented in a small area.

14 Claims, 30 Drawing Sheets

(56) References Cited

U.S. PATENT DOCUMENTS

| | | |
|---|---|---|
| 2011/0075500 A1 | 3/2011 | Kodama et al. |
| 2011/0317467 A1 | 12/2011 | Nagayama |
| 2012/0113707 A1* | 5/2012 | Takemura ............... G11C 11/40 |
| | | 365/149 |
| 2012/0294070 A1* | 11/2012 | Matsuzaki ............ G11C 11/404 |
| | | 365/149 |
| 2013/0187233 A1* | 7/2013 | Yun ....................... H10B 41/35 |
| | | 257/E27.081 |
| 2014/0219016 A1* | 8/2014 | Li ........................... G06F 30/30 |
| | | 365/182 |
| 2014/0269063 A1* | 9/2014 | Nagatsuka ............. G11C 16/08 |
| | | 365/185.05 |
| 2014/0269099 A1* | 9/2014 | Nagatsuka ....... H01L 29/78696 |
| | | 365/185.23 |
| 2014/0286073 A1* | 9/2014 | Onuki ................... G11C 11/565 |
| | | 365/189.011 |
| 2017/0148505 A1* | 5/2017 | Kwon ................... H10B 10/12 |
| 2018/0026042 A1 | 1/2018 | Smith et al. |
| 2018/0040695 A1 | 2/2018 | Smith et al. |
| 2018/0047832 A1 | 2/2018 | Tapily et al. |
| 2018/0151576 A1* | 5/2018 | Lee .................... H01L 21/8238 |

FOREIGN PATENT DOCUMENTS

| | | |
|---|---|---|
| JP | 2018-026565 A | 2/2018 |
| WO | 2009/122560 A1 | 10/2009 |

OTHER PUBLICATIONS

Written Opinion of International Researching Authority issued in International Patent Application No. PCT/JP2020/024197, dated Aug. 25, 2020; with English translation.

Ryckaert J. et al., "The Complementary FET (CFET) for CMOS scaling beyond N3", 2018 Symposium on VLSI Technology Digest of Technical Papers; pp. 141-142.

A. Mocuta et al., "Enabling CMOS Scaling Towards 3nm and Beyond", 2018 Symposium on VLSI Technology Digest of Technical Papers; pp. 147-148.

* cited by examiner

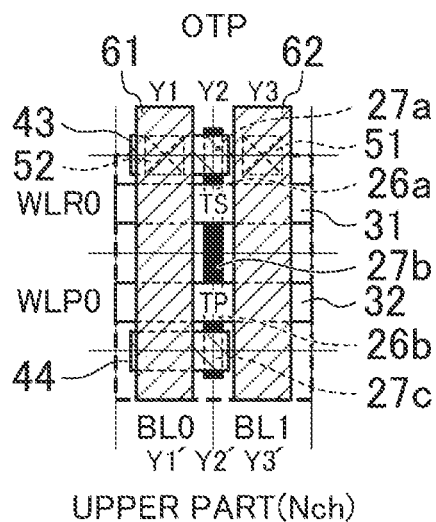
FIG.2A
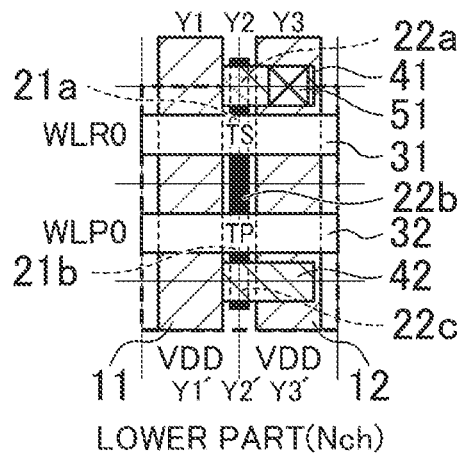
FIG.2B
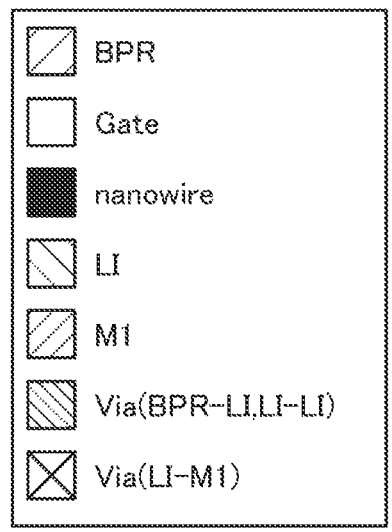

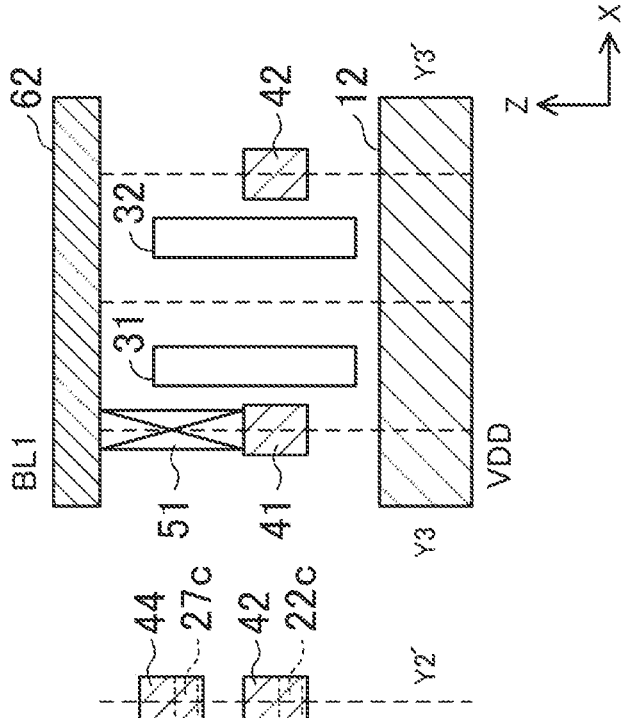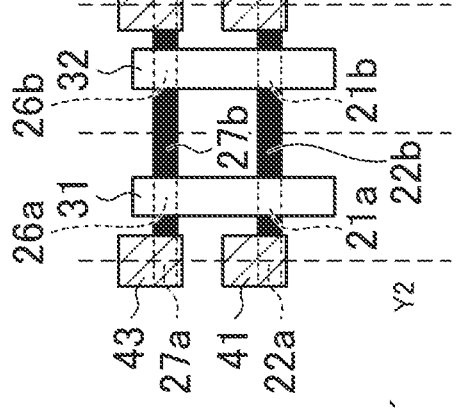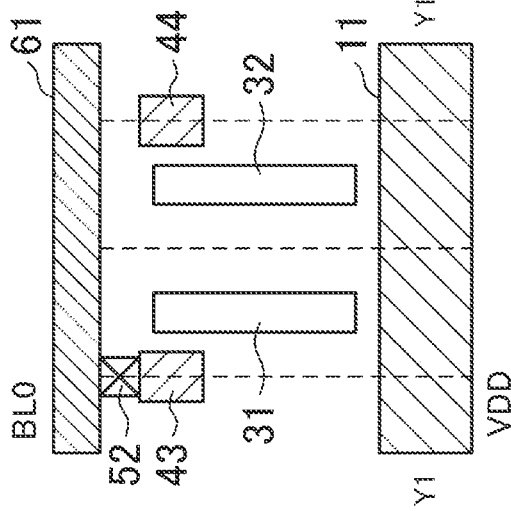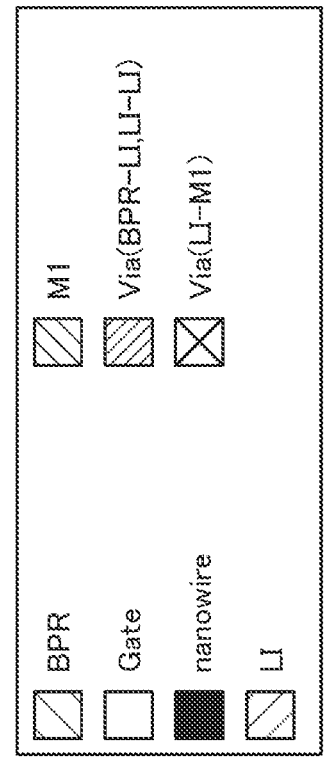

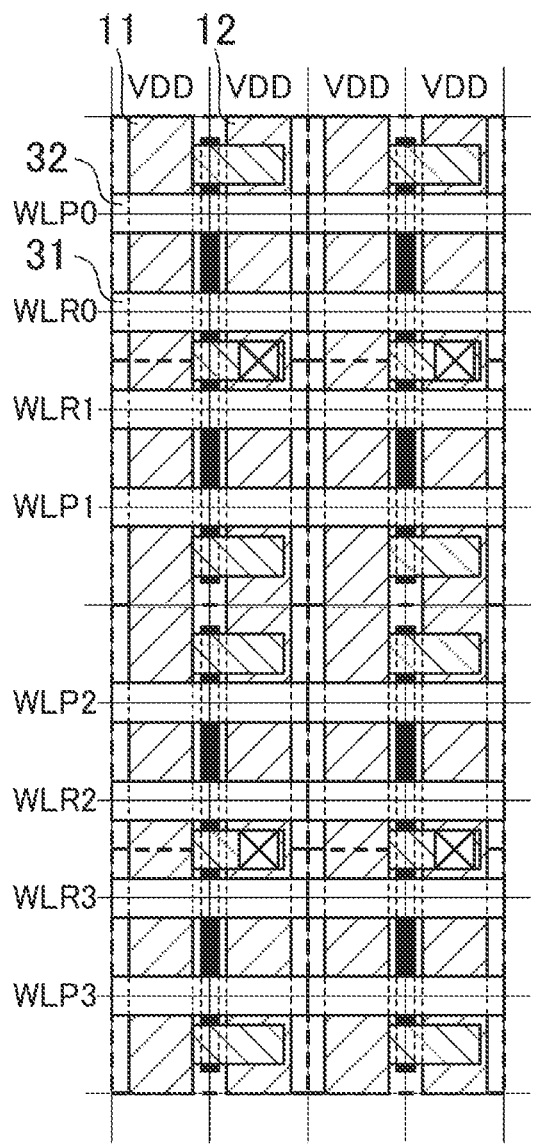
FIG.5
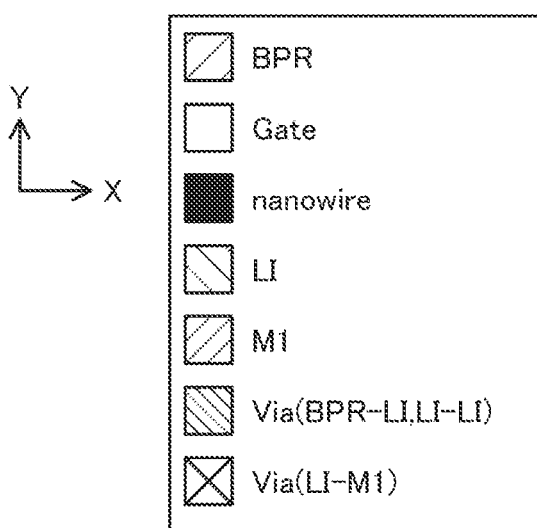

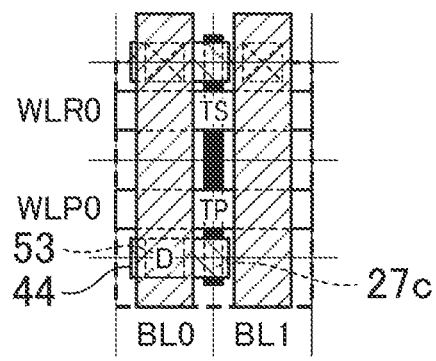
FIG.8A
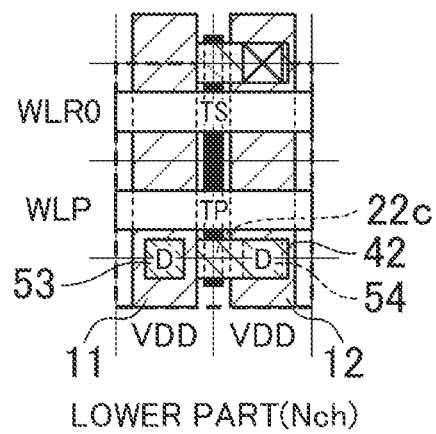
FIG.8B
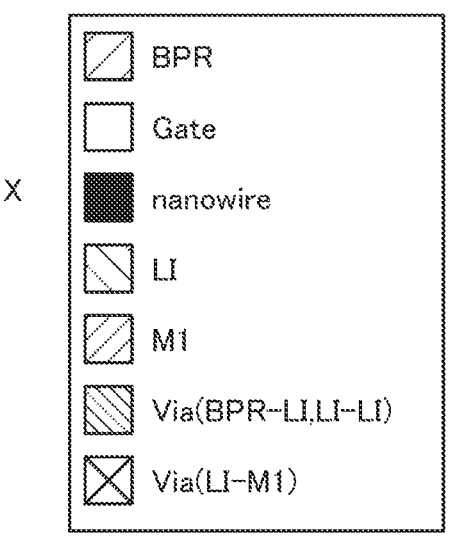

FIG.9A OTP
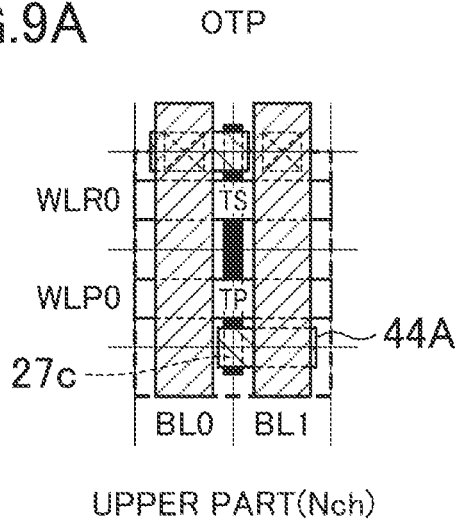
UPPER PART(Nch)
FIG.9B
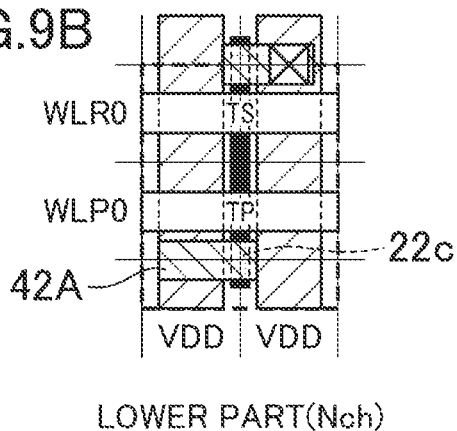
LOWER PART(Nch)
FIG.9C ROM
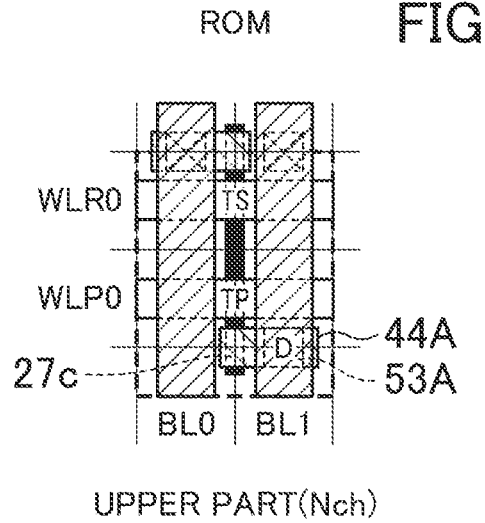
UPPER PART(Nch)
FIG.9D
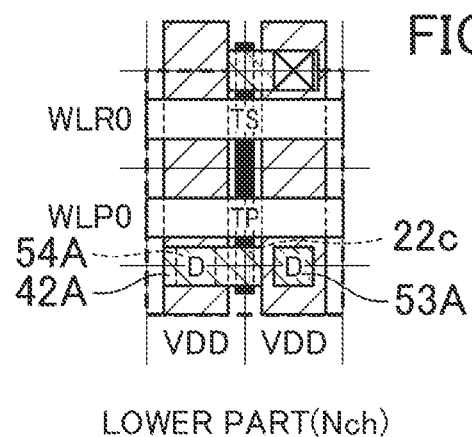
LOWER PART(Nch)
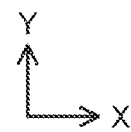
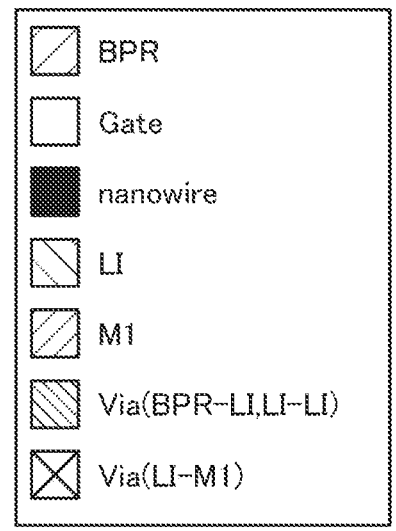

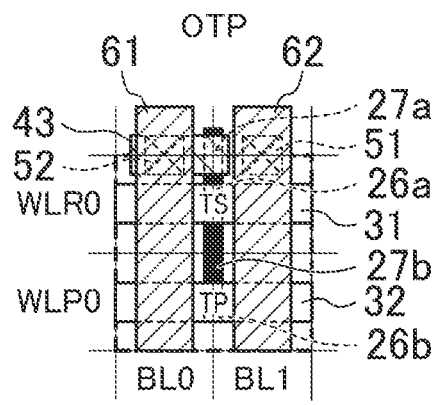
FIG.10A
UPPER PART(Nch)
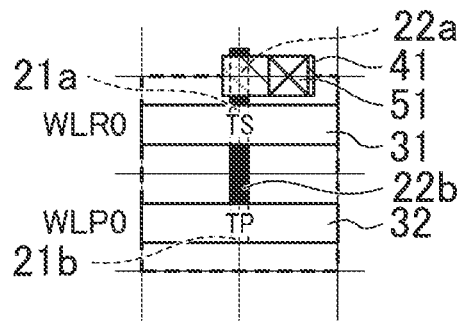
FIG.10B
LOWER PART(Nch)
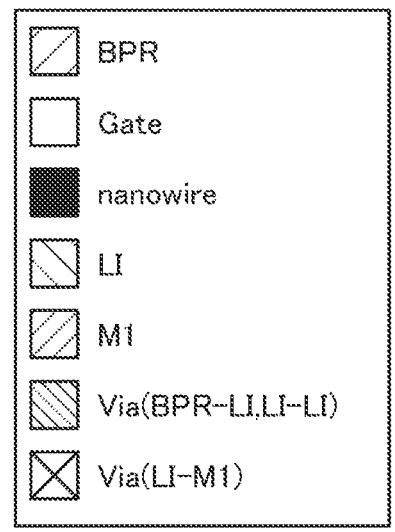

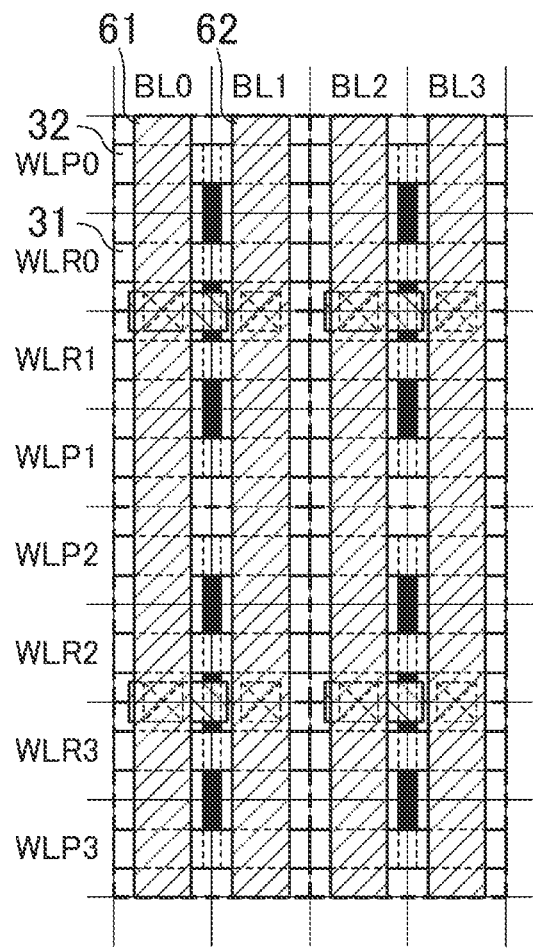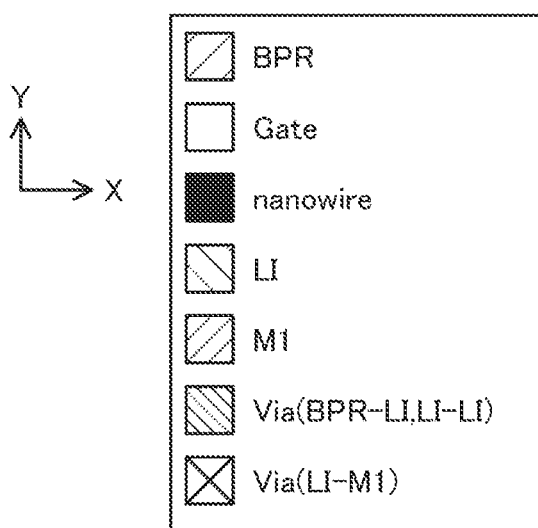
FIG.11

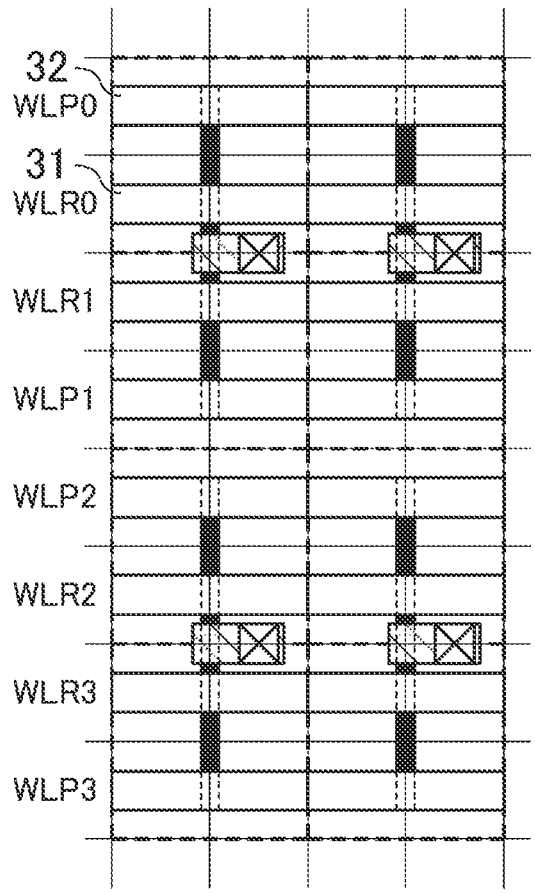
FIG.12
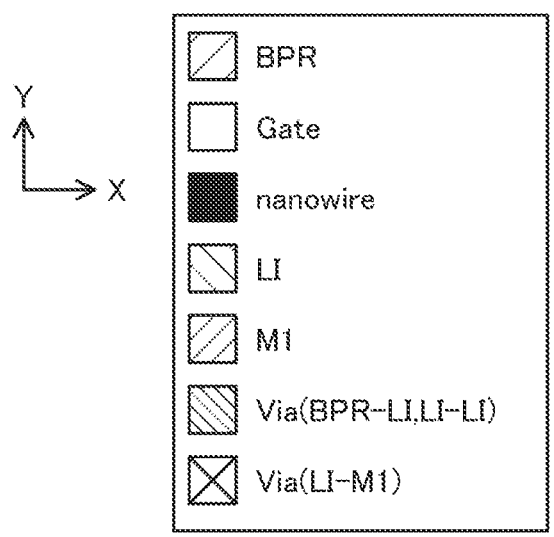

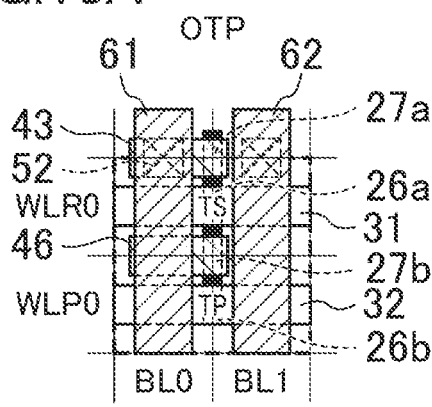
FIG.13A
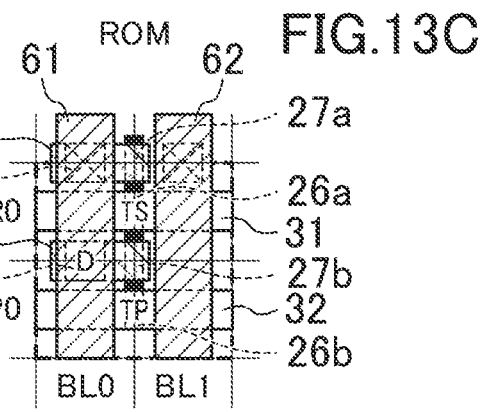
FIG.13C
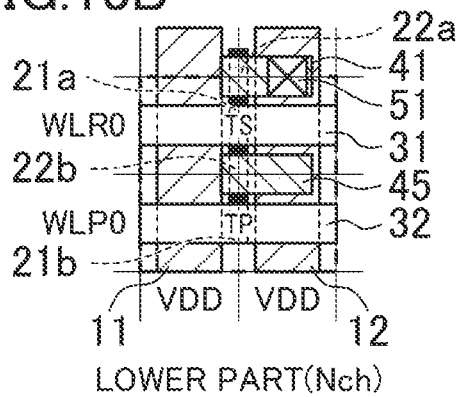
FIG.13B
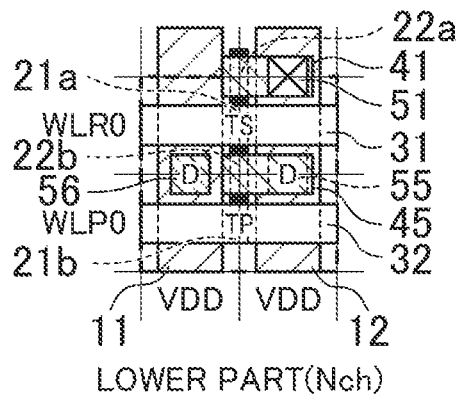
FIG.13D
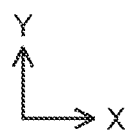
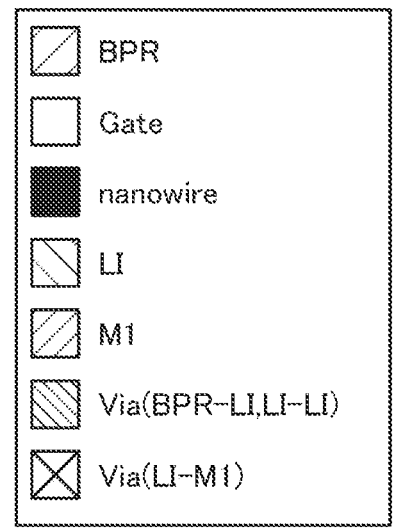

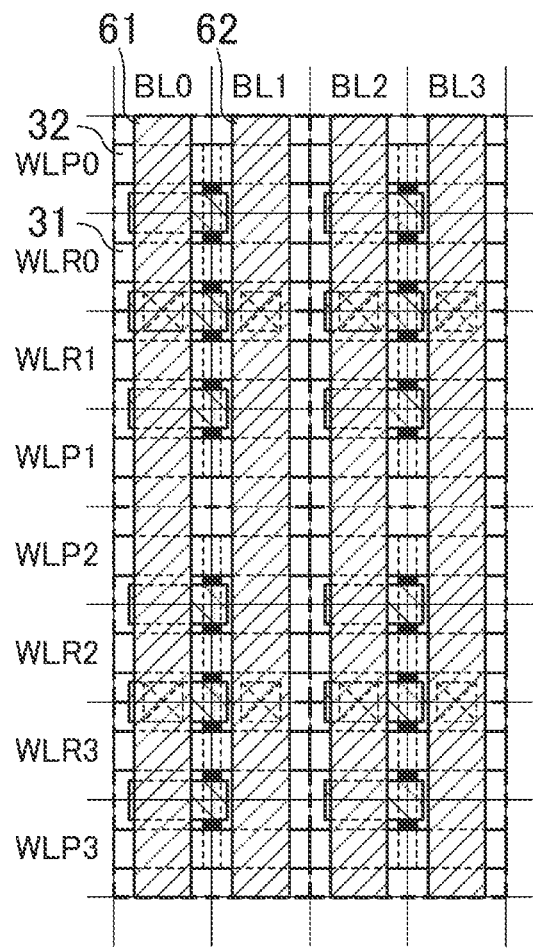
FIG.15
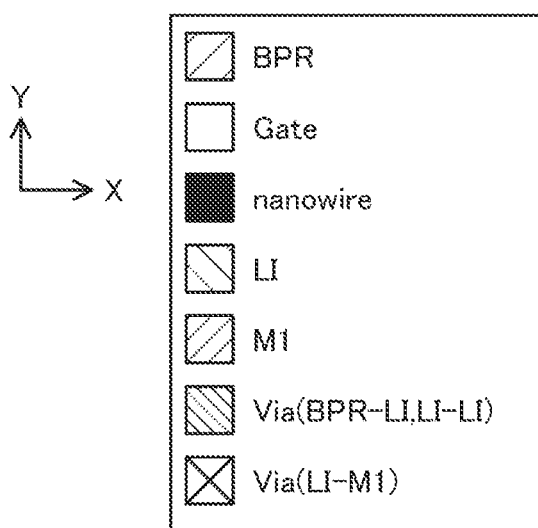

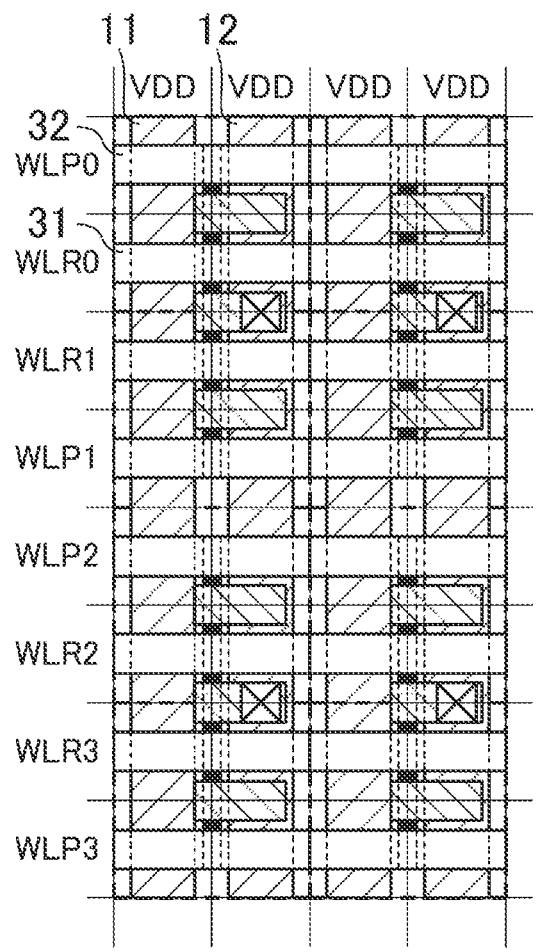
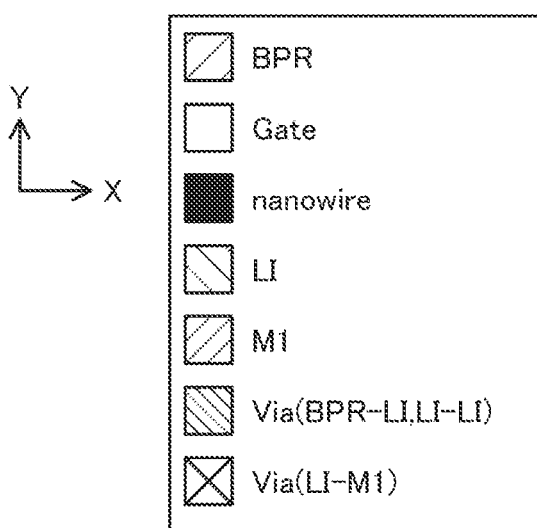
FIG.16

OTP

MASK ROM

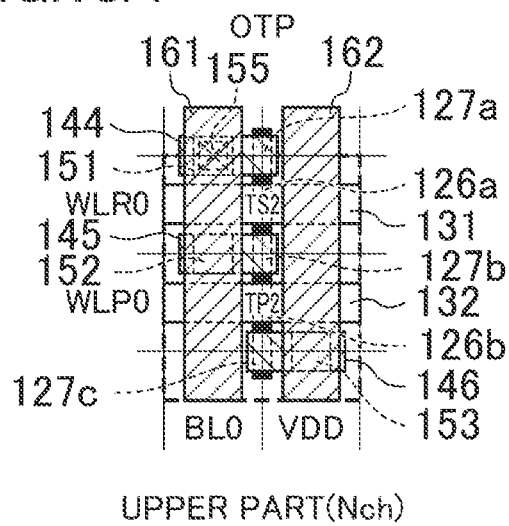
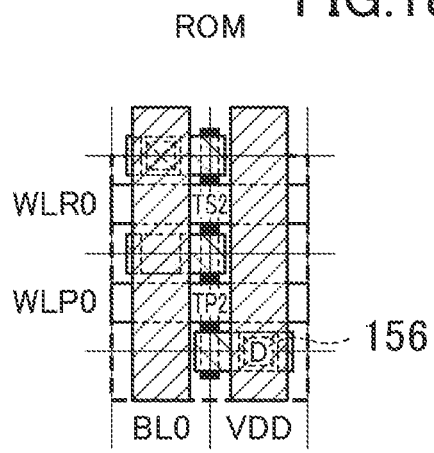
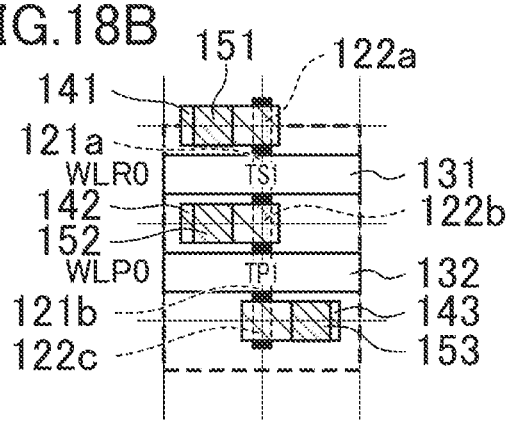
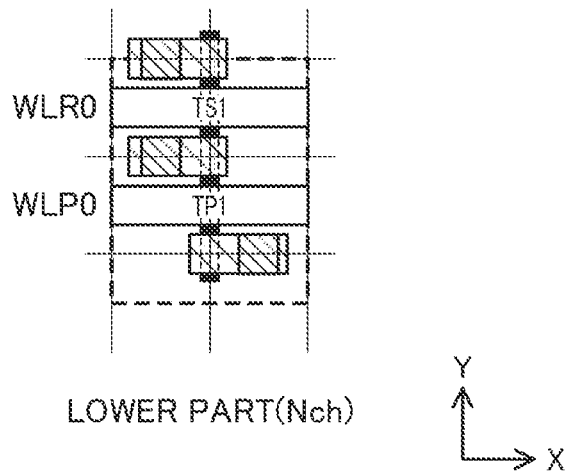
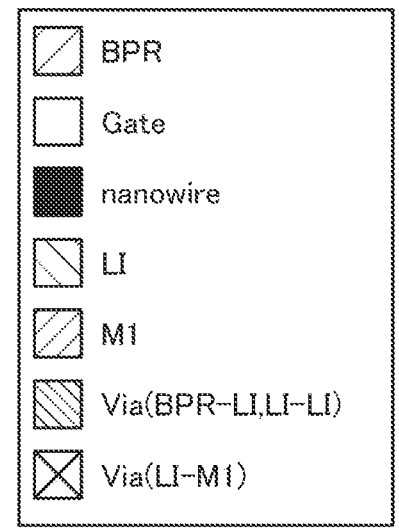

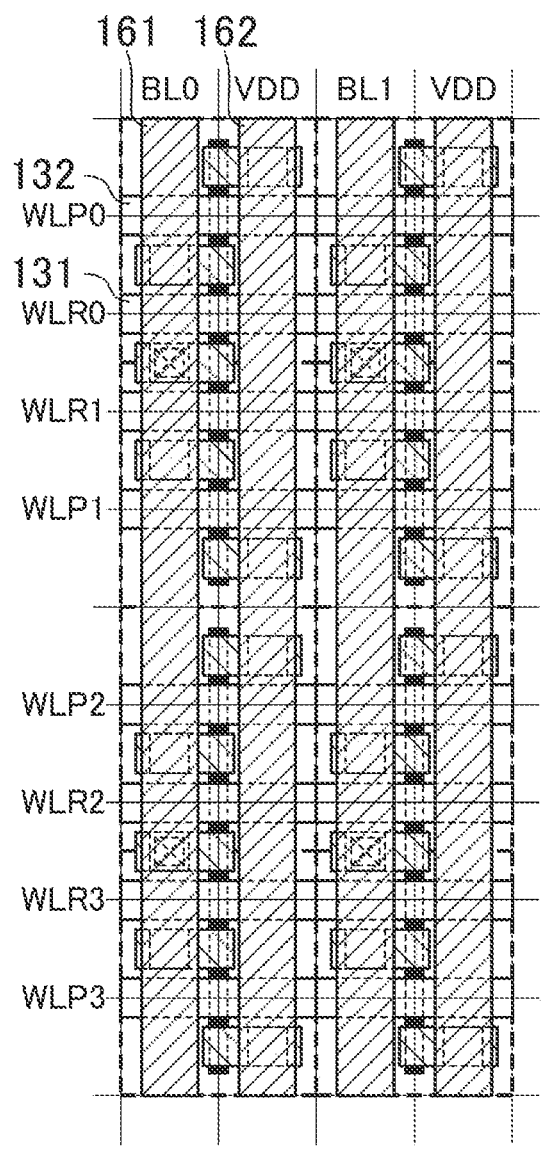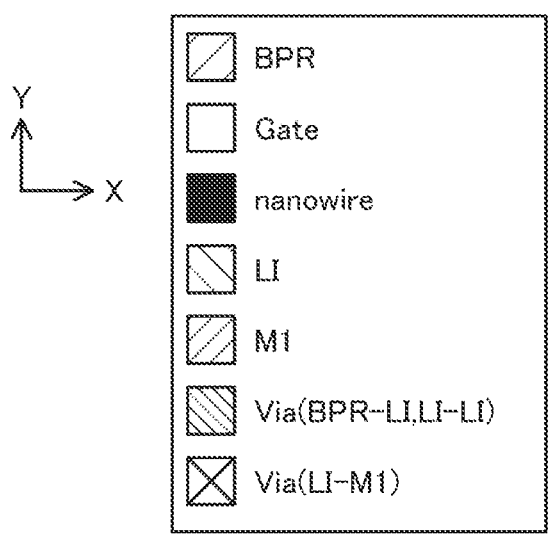
FIG.19

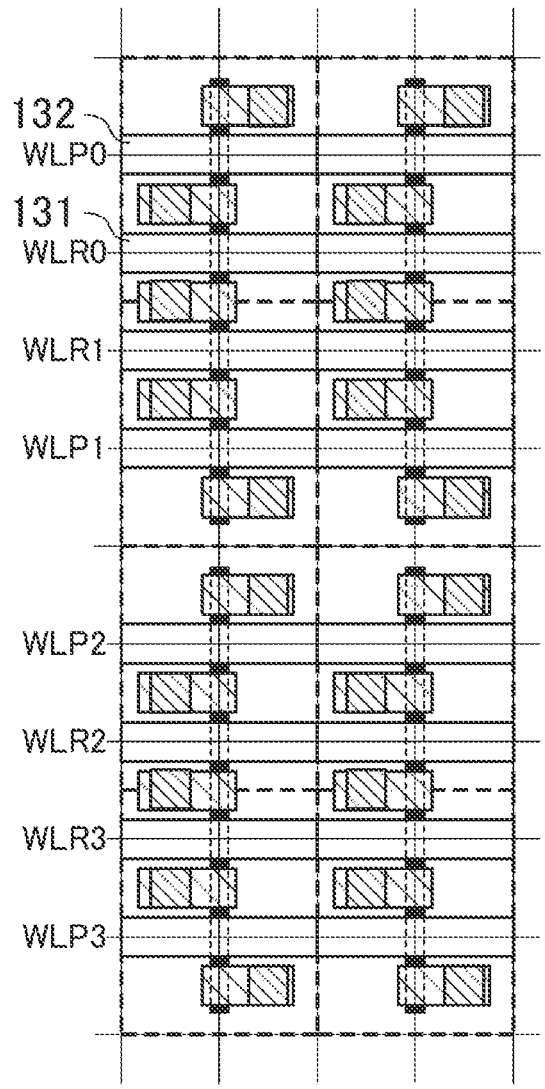
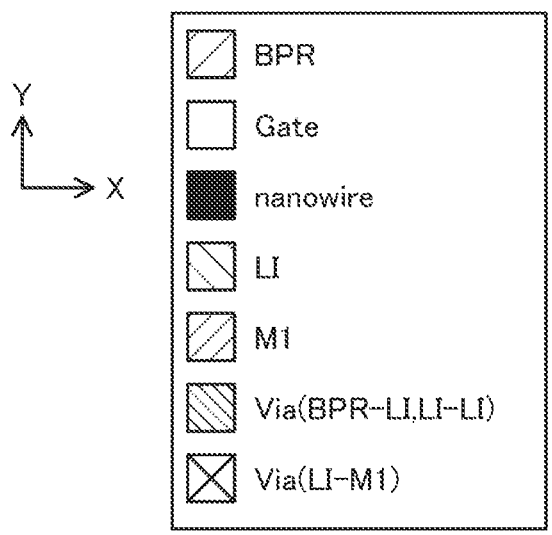
FIG.20

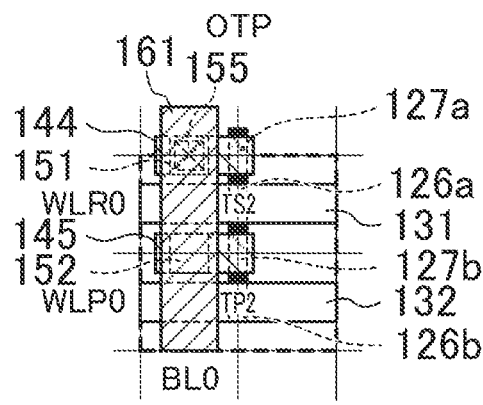
FIG.21A
UPPER PART(Nch)
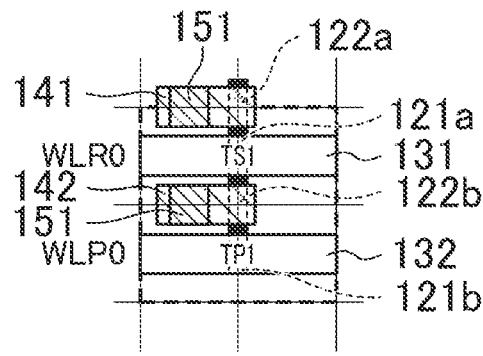
FIG.21B
LOWER PART(Nch)
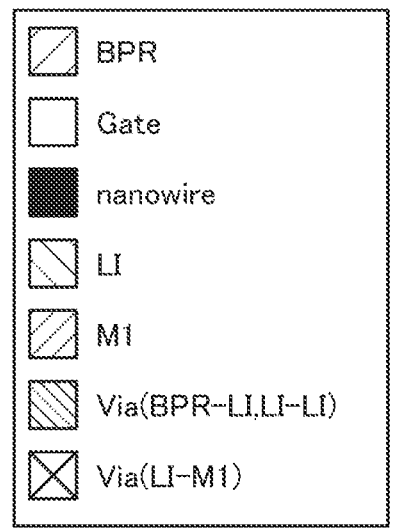

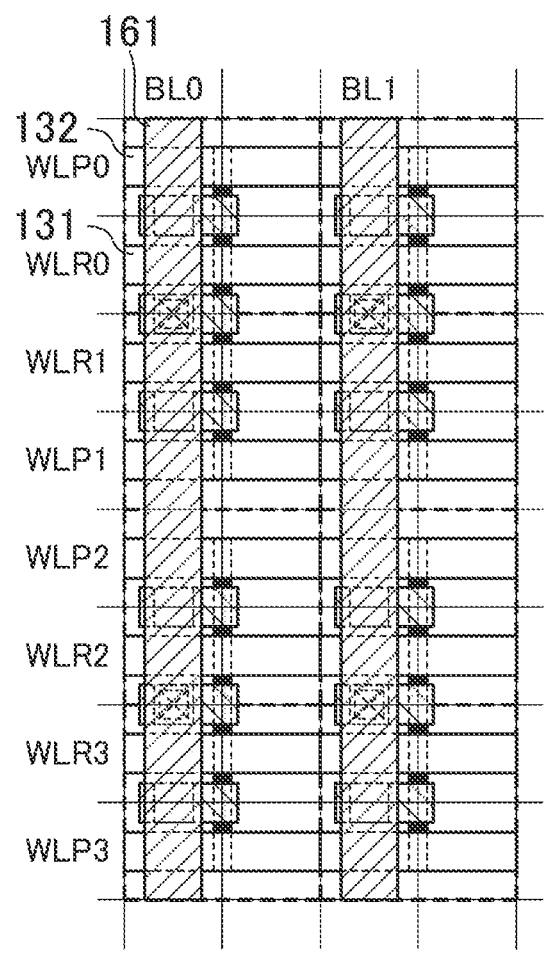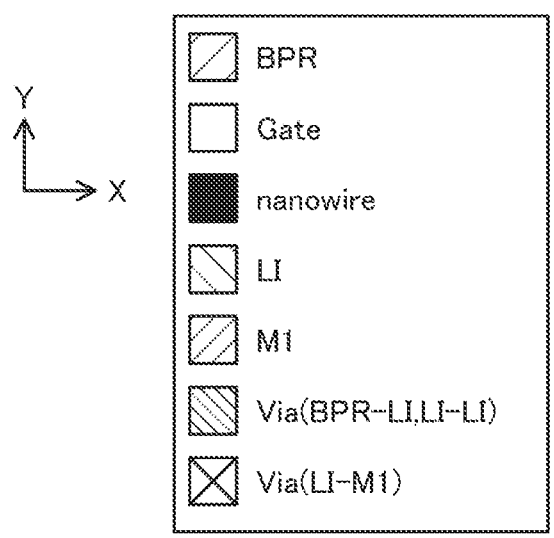
FIG.22

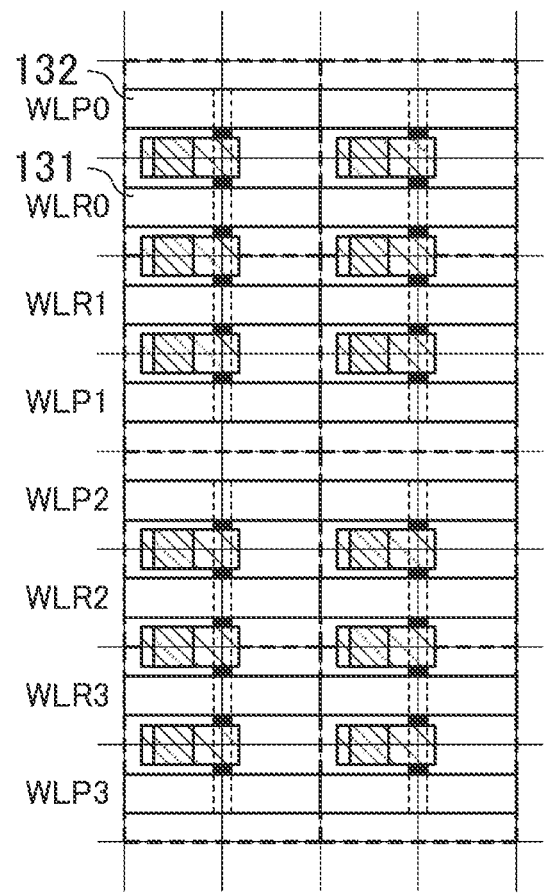
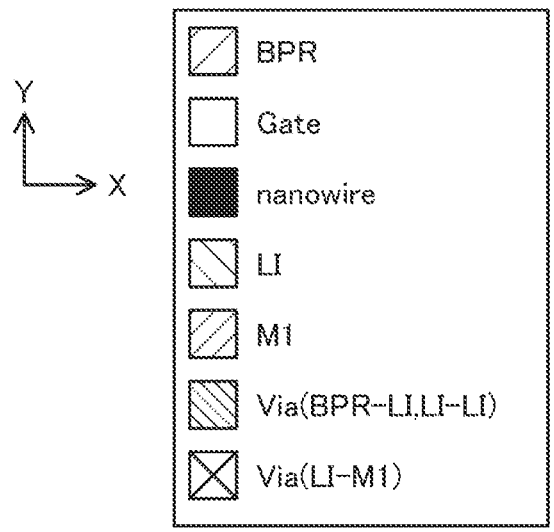
FIG.23

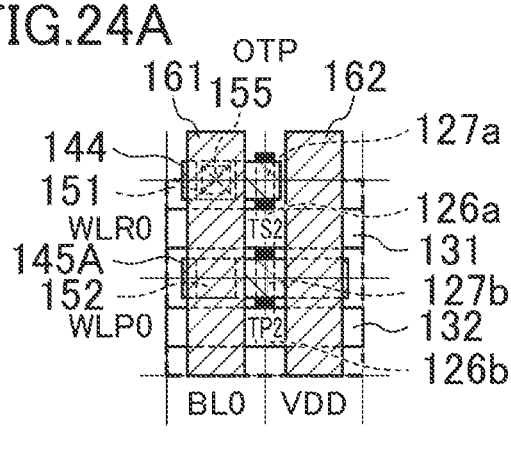
FIG.24A
UPPER PART(Nch)
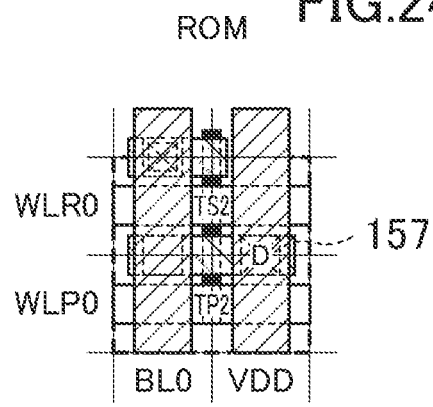
FIG.24C
UPPER PART(Nch)
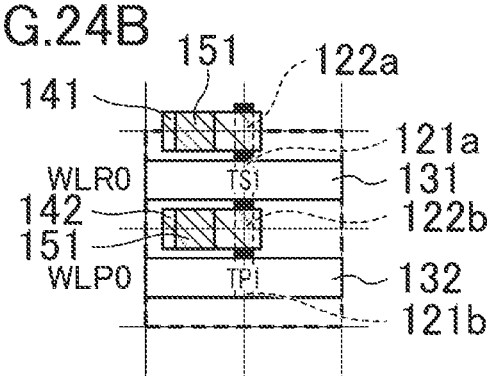
FIG.24B
LOWER PART(Nch)
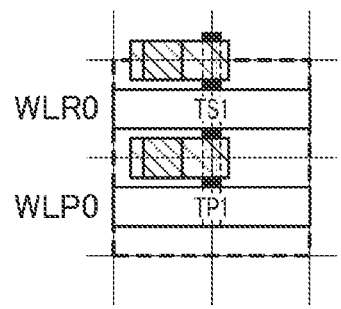
FIG.24D
LOWER PART(Nch)
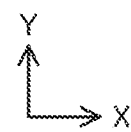
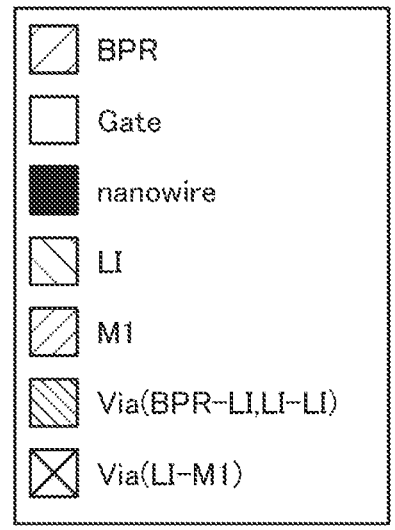

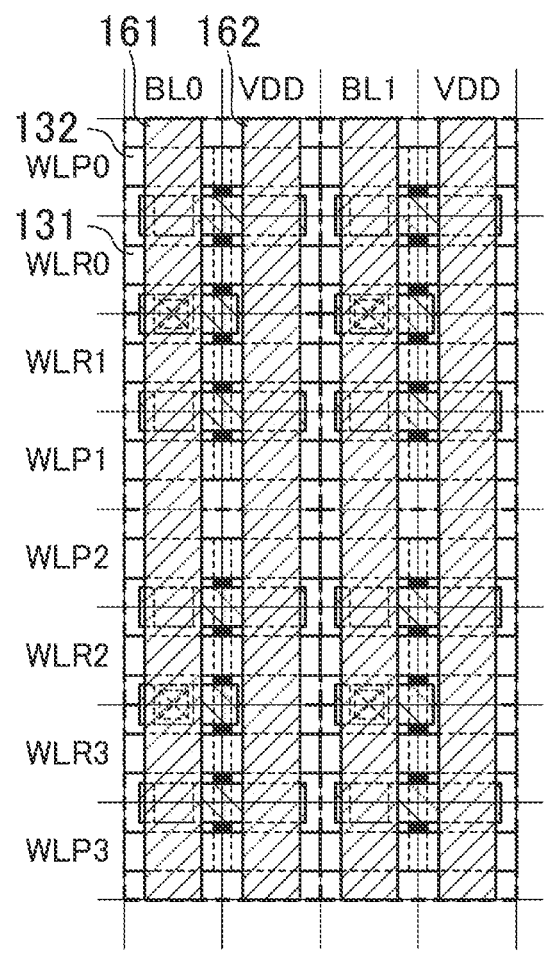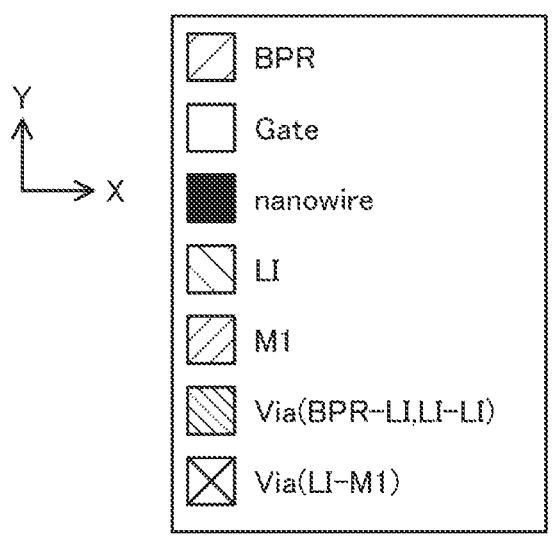
FIG.25

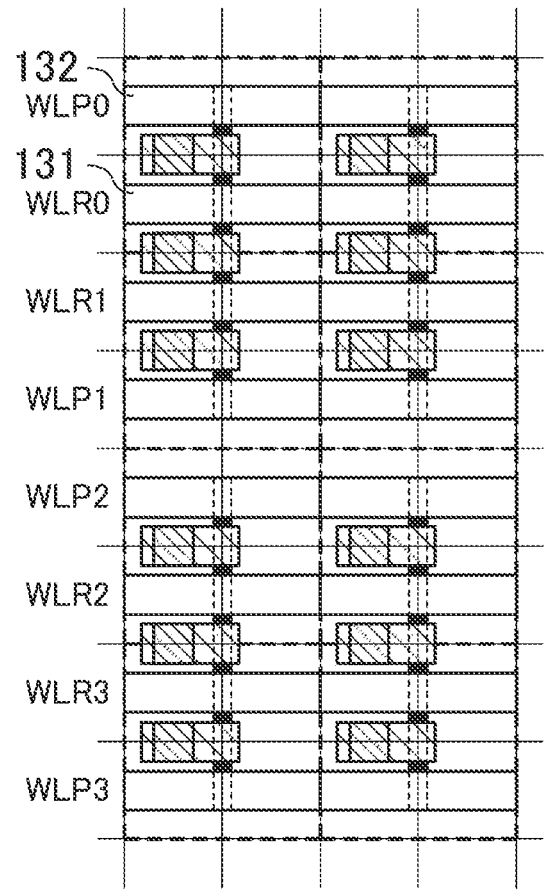
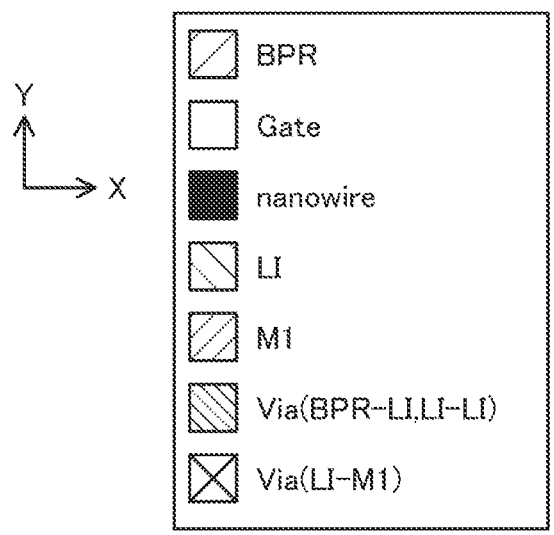
FIG.26

SEMICONDUCTOR STORAGE DEVICE

CROSS-REFERENCE TO RELATED APPLICATIONS

This is a continuation of International Application No. PCT/JP2020/024197 filed on Jun. 19, 2020, which claims priority to Japanese Patent Application No. 2019-121747 filed on Jun. 28, 2019. The entire disclosures of these applications are incorporated by reference herein.

BACKGROUND

The present disclosure relates to a semiconductor storage device using complementary FET (CFET) devices, and more particularly to a layout structure of a nonvolatile memory cell using a CFET.

A semiconductor storage device provided with nonvolatile memory cells are used in many applications. As one type of nonvolatile memory cells, there is a one time programmable (OTP) memory cell, which is characterized in storing a state of "1" or "0" in the memory by breakdown of an insulating film or other means and reading the stored state.

U.S. Pat. No. 7,402,855 discloses a configuration of an OTP memory. In this configuration, one transistor has a gate oxide film having two portions different in thickness, and by breaking the thinner portion of the gate oxide film, a state of "1" or "0" is stored in the memory.

As for transistors as basic constituents of an LSI, scaling down of the gate length has led to the improvement in integration degree, the reduction in operating voltage, and the improvement in operating speed. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and standard cells using such devices.

As used herein, a three-dimensional device in which three-dimensional p-type FET and n-type FET are stacked vertically to a substrate is called a complementary FET (CFET) following the cited paper by Ryckaert J. et al. Also, the direction vertical to the substrate is herein called the depth direction.

Until now, however, no examination has been made on the layout structure of an OTP memory using a CFET.

An objective of the present disclosure is providing a layout structure of a small-area OTP memory using a CFET.

SUMMARY

According to the first mode of the present disclosure, a semiconductor storage device provided with a nonvolatile memory cell, includes: first and second word lines extending in a first direction; and first and second bit lines extending in a second direction perpendicular to the first direction, wherein the memory cell includes a first program transistor having a gate connected to the first word line, a first switch transistor, provided between the first program transistor and the first bit line, having a gate connected to the second word line, a second program transistor having a gate connected to the first word line, and a second switch transistor, provided between the second program transistor and the second bit line, having a gate connected to the second word line, the first and second program transistors are three-dimensional transistors of which channel portions overlap each other as viewed in plan, the first and second switch transistors are three-dimensional transistors of which channel portions overlap each other as viewed in plan, the first program transistor and the first switch transistor are formed in a first layer, the second program transistor and the second switch transistor are formed in a second layer located below the first layer, and the memory cell includes a first local interconnect that is connected to a drain of the first switch transistor and extends from the first switch transistor toward a first-oriented direction in the first direction.

According to the above mode, in the memory cell, the first program transistor and the first switch transistor implement an OTP memory of one bit, and the second program transistor and the second switch transistor implement an OTP memory of one bit. The first and second program transistors are three-dimensional transistors of which channel portions overlap each other as viewed in plan, and the first and second switch transistors are three-dimensional transistors of which channel portions overlap each other as viewed in plan. In this way, an OTP memory of two bits can be implemented in a small area.

According to the second mode of the present disclosure, a semiconductor storage device provided with a nonvolatile memory cell, includes: first and second word lines extending in a first direction; and a first bit line extending in a second direction perpendicular to the first direction, wherein the memory cell includes a first program element having a gate connected to the first word line, and a first switch element, provided between the first program element and the first bit line, having a gate connected to the second word line, the first program element has first and second program transistors that are three-dimensional transistors connected in parallel of which channel portions overlap each other as viewed in plan, and the first switch element includes a first switch transistor that is a three-dimensional transistor formed in a same layer as either one of the first and second program transistors.

According to the above mode, in the memory cell, the first program element and the first switch element implement an OTP memory of one bit. The first program element has first and second program transistors that are three-dimensional transistors of which channel portions overlap each other as viewed in plan. Therefore, even when data write, i.e., breakdown of the gate oxide film has not been sufficiently done in one program transistor, the signal of the bit line can be changed by the other program transistor, whereby stored data can be read correctly. Also, with the two program transistors, speedup of the read operation becomes possible. In addition, since the channel portions of the first and second program transistors overlap each other as viewed in plan, the memory cell can be implemented in a small area.

According to the present disclosure, a layout structure of a small-area OTP memory using a CFET can be provided.

BRIEF DESCRIPTION OF THE DRAWINGS

FIG. 1A is a block diagram of a memory cell array and FIG. 1B is a circuit diagram of a memory cell.

FIGS. 2A and 2B are plan views showing a layout structure example of the memory cell according to the first embodiment.

FIGS. 3A to 3C are cross-sectional views of the memory cell of FIGS. 2A-2B.

FIG. 5 shows a layout structure of a lower part of the memory cell array using the memory cell of FIGS. 2A-2B and 3A-3C.

FIGS. 8A and 8B are plan views showing a layout structure example of the mask ROM cell of FIG. 7.

FIGS. 9A to 9D are plan views showing layout structure examples of memory cells according to Alteration 1 of the first embodiment, where FIGS. 9A and 9B show an OTP memory cell and FIGS. 9C and 9D show a mask ROM cell.

FIGS. 10A and 10B are plan views showing a layout structure example of a memory cell according to Alteration 2 of the first embodiment.

FIG. 11 shows a layout structure of an upper part of a memory cell array using the memory cell of FIGS. 10A-10B.

FIG. 12 shows a layout structure of a lower part of the memory cell array using the memory cell of FIGS. 10A-10B.

FIGS. 13A to 13D are plan views showing layout structure examples of memory cells according to Alteration 3 of the first embodiment, where FIGS. 13A and 13B show an OTP memory cell and FIGS. 13C and 13D show a mask ROM cell.

FIG. 15 shows a layout structure of an upper part of a memory cell array using the memory cell of FIGS. 13A-13B.

FIG. 16 shows a layout structure of a lower part of the memory cell array using the memory cell of FIGS. 13A-13B.

FIG. 17A shows an OTP memory and FIG. 17B shows a mask ROM.

FIGS. 18A to 18D are plan views showing layout structure examples of the memory cells according to the second embodiment, where FIGS. 18A and 18B show the OTP memory cell and FIGS. 18C and 18D show the mask ROM cell.

FIG. 19 shows a layout structure of an upper part of a memory cell array using the memory cell of FIGS. 18A-18B.

FIG. 20 shows a layout structure of a lower part of the memory cell array using the memory cell of FIGS. 18A-18B.

FIGS. 21A and 21B are plan views showing a layout structure example of a memory cell according to Alteration 1 of the second embodiment.

FIG. 22 shows a layout structure of an upper part of a memory cell array using the memory cell of FIGS. 21A-21B.

FIG. 23 shows a layout structure of a lower part of the memory cell array using the memory cell of FIGS. 21A-21B.

FIGS. 24A to 24D are plan views showing layout structure examples of memory cells according to Alteration 2 of the second embodiment, where FIGS. 24A and 24B show an OTP memory cell and FIGS. 24C and 24D show a mask ROM cell.

FIG. 25 shows a layout structure of an upper part of a memory cell array using the memory cell of FIGS. 24A-24B.

FIG. 26 shows a layout structure of a lower part of the memory cell array using the memory cell of FIGS. 24A-24B.

DETAILED DESCRIPTION

Figure 27:
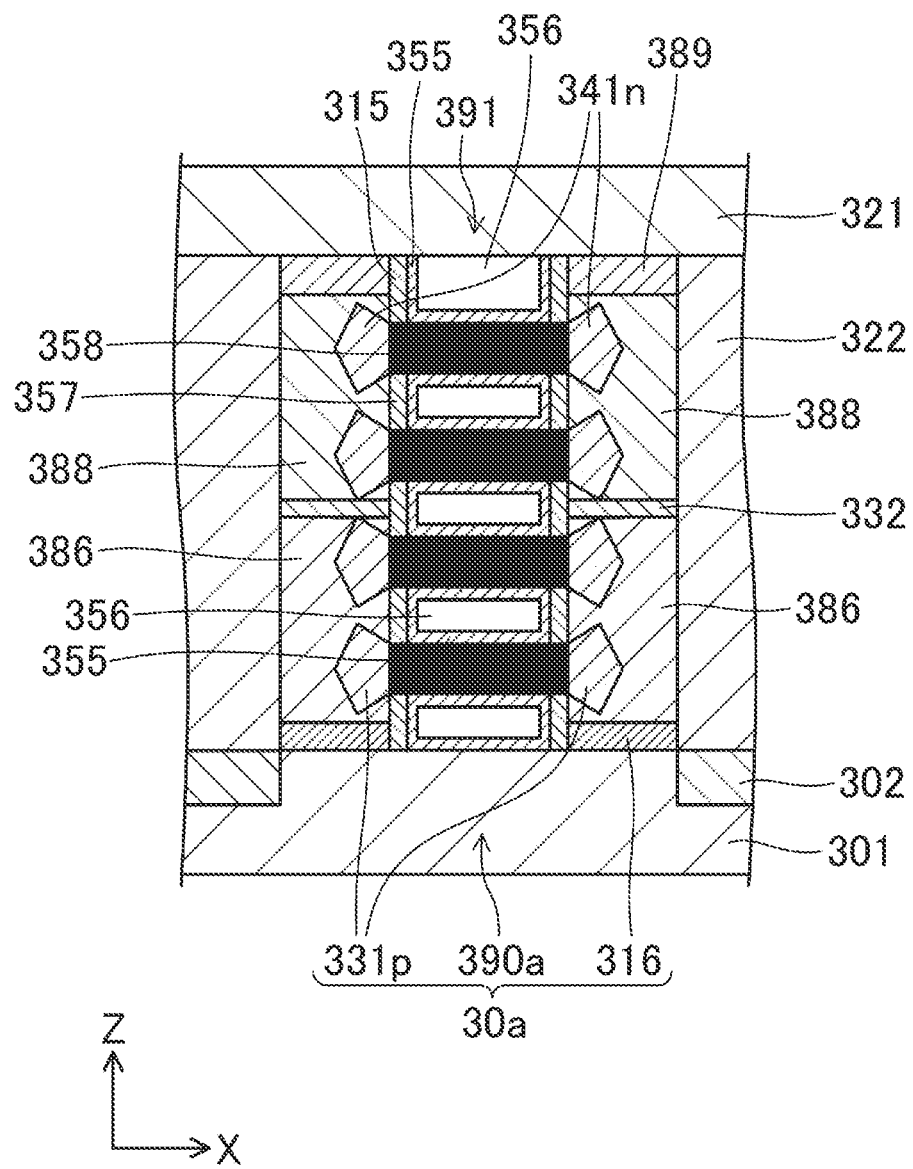
FIG. 27 is a cross-sectional view showing a structure of a semiconductor device provided with a CFET.
Figure 28:
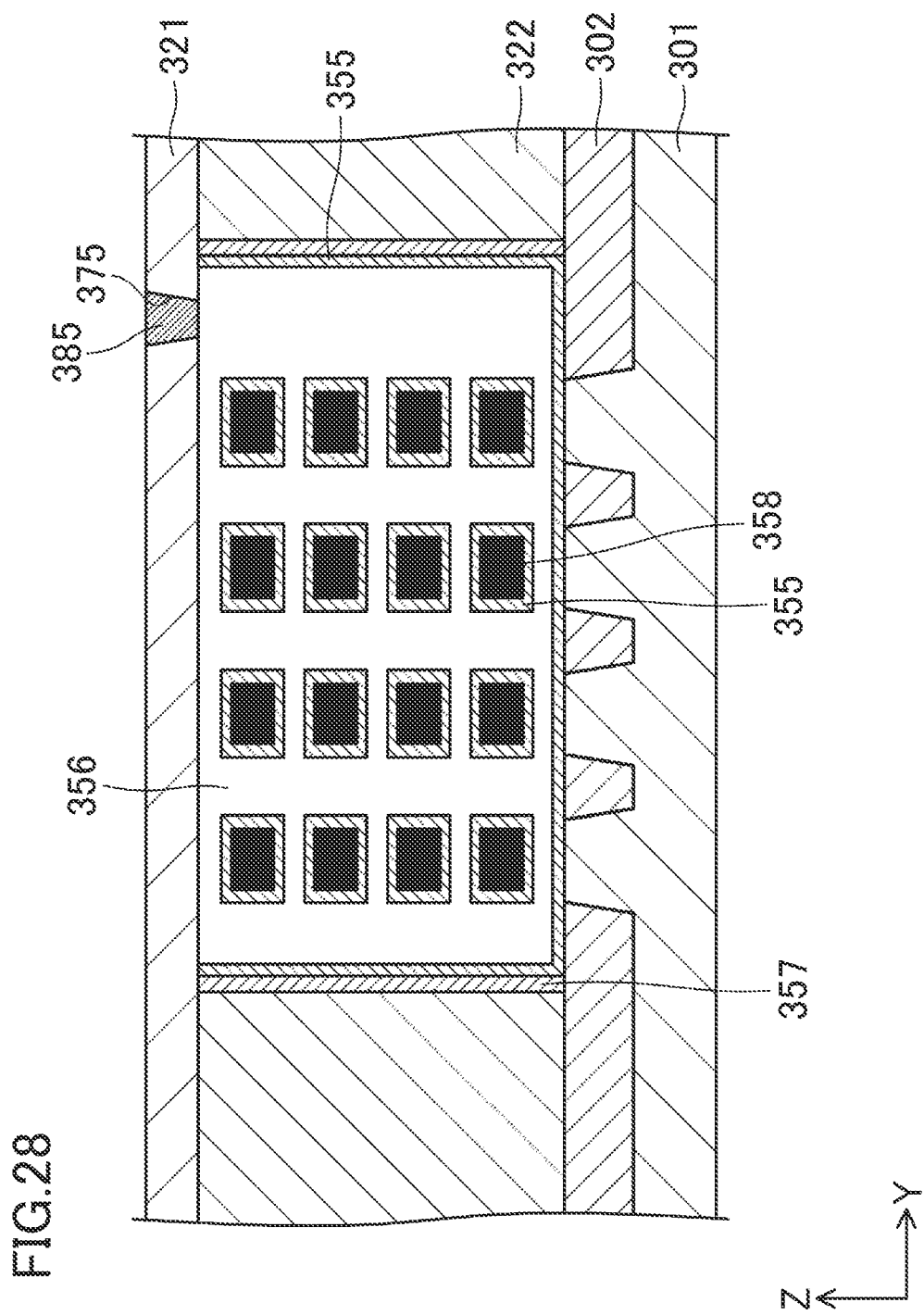
FIG. 28 is a cross-sectional view showing the structure of the semiconductor device provided with a CFET.
Figure 29:
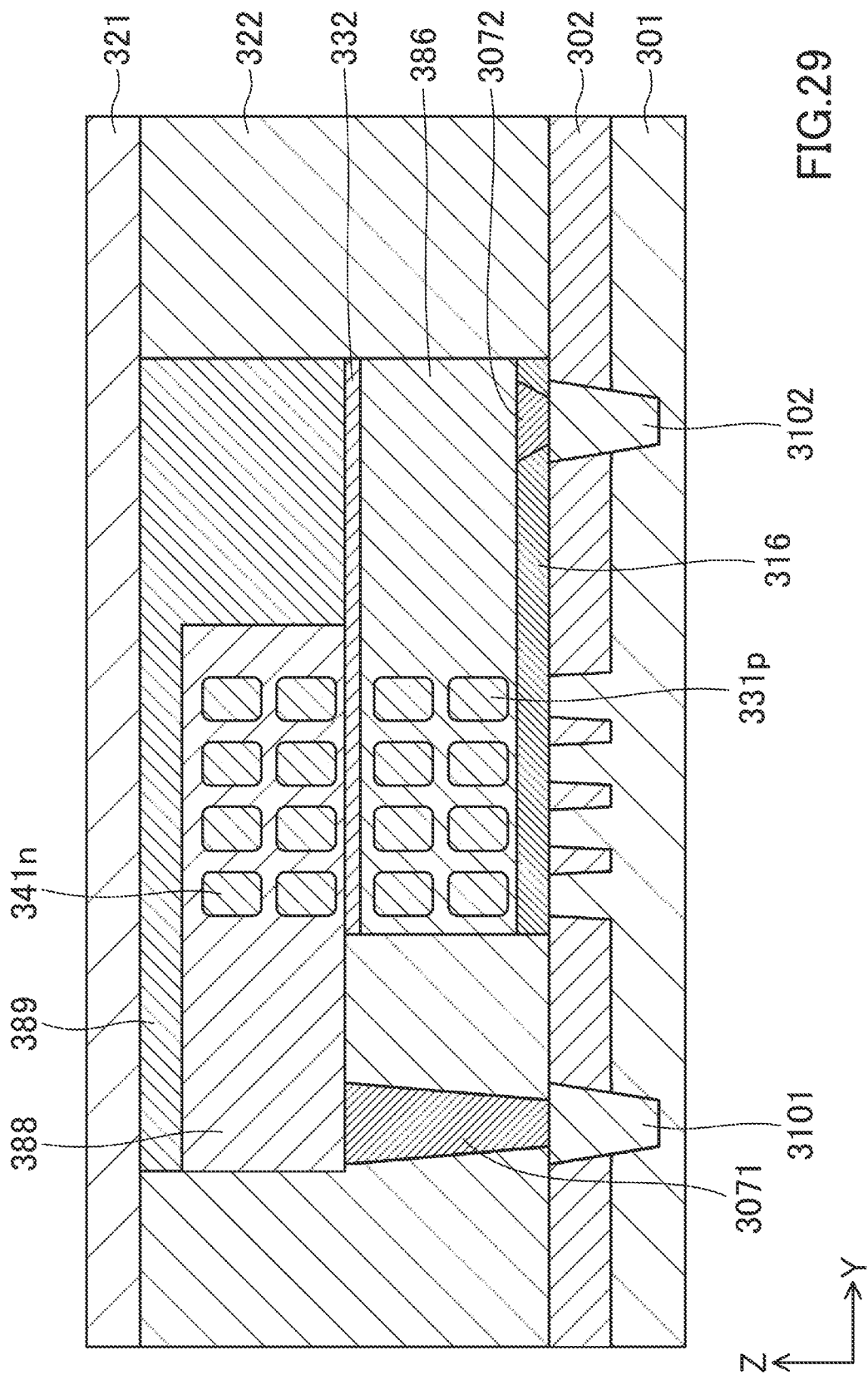
FIG. 29 is a cross-sectional view showing the structure of the semiconductor device provided with a CFET.
Figure 30:
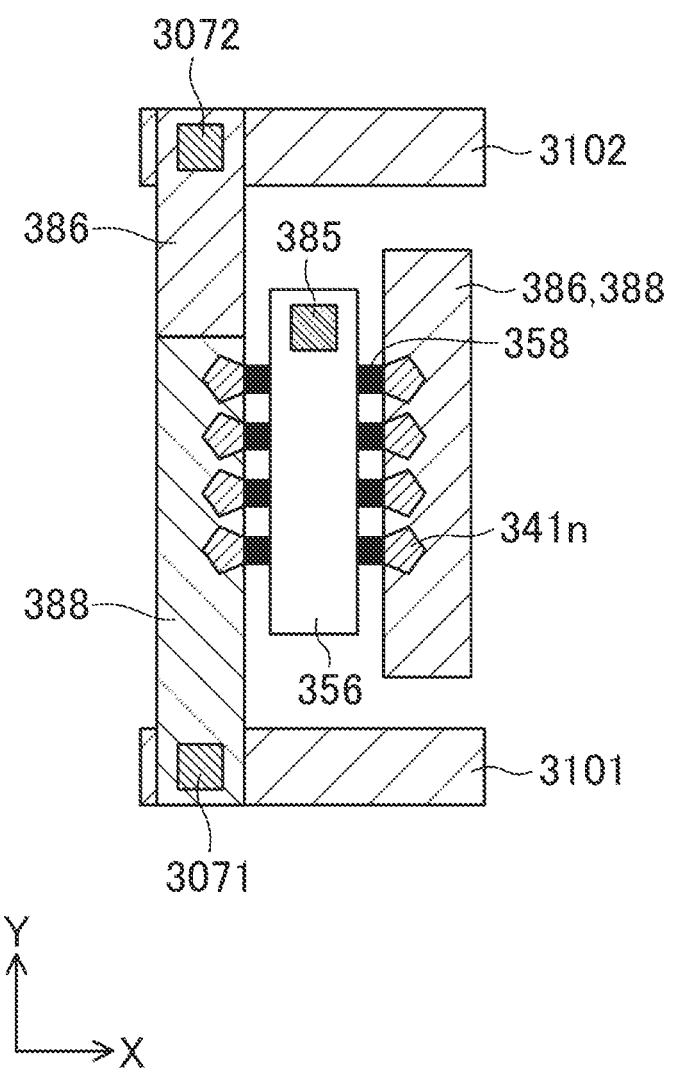
FIG. 30 is a plan view showing the structure of the semiconductor device provided with a CFET.

First, the basic structure of the CFET will be described. FIGS. 27 to 30 are views showing a structure of a semiconductor device provided with a CFET, where FIG. 27 is a cross-sectional view taken in an X direction, FIG. 28 is a cross-sectional view of a gate portion taken in a Y direction, FIG. 29 is a cross-sectional view of a source/drain portion taken in the Y direction, and FIG. 30 is a plan view. Note that the X direction refers to the direction in which nanowires extend, the Y direction refers to the direction in which a gate extends, and a Z direction refers to the direction vertical to the substrate plane. Note also that FIGS. 27 to 30 are schematic views in which the dimensions and positions of the components are not necessarily consistent with one another.

In this semiconductor device, an element isolation region 302 is formed on a semiconductor substrate 301 such as a silicon (Si) substrate, and an element active region 30a is defined by the element isolation region 302. In the element active region 30a, an n-type FET is formed above a p-type FET.

In the element active region 30a, a stacked transistor structure 390a is formed on the semiconductor substrate 301. The stacked transistor structure 390a includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 28, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 29, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

As used herein, a semiconductor layer portion formed on each end of a nanowire to constitute a terminal that is to be the source or drain of a transistor is called a "pad". In the illustrated example of the basic structure of the CFET, the p-type semiconductor layers 331p and the n-type semiconductor layers 341n correspond to pads.

Note that, in the plan views and cross-sectional views in the following embodiments, illustration of various insulating films may be omitted in some cases. Also, nanowires and pads at both ends of the nanowires may be illustrated in simplified linear shapes in some cases. Also, as used herein, an expression indicating that sizes, etc. are identical, such as the "same size," is to be understood as including a range of manufacturing variations.

In the following embodiments, the source and drain of a transistor may be called the nodes of the transistor. Also, "VDD" and "VSS" are used for indicating the power supply voltages or the power supplies themselves.

First Embodiment

Figure 1A:
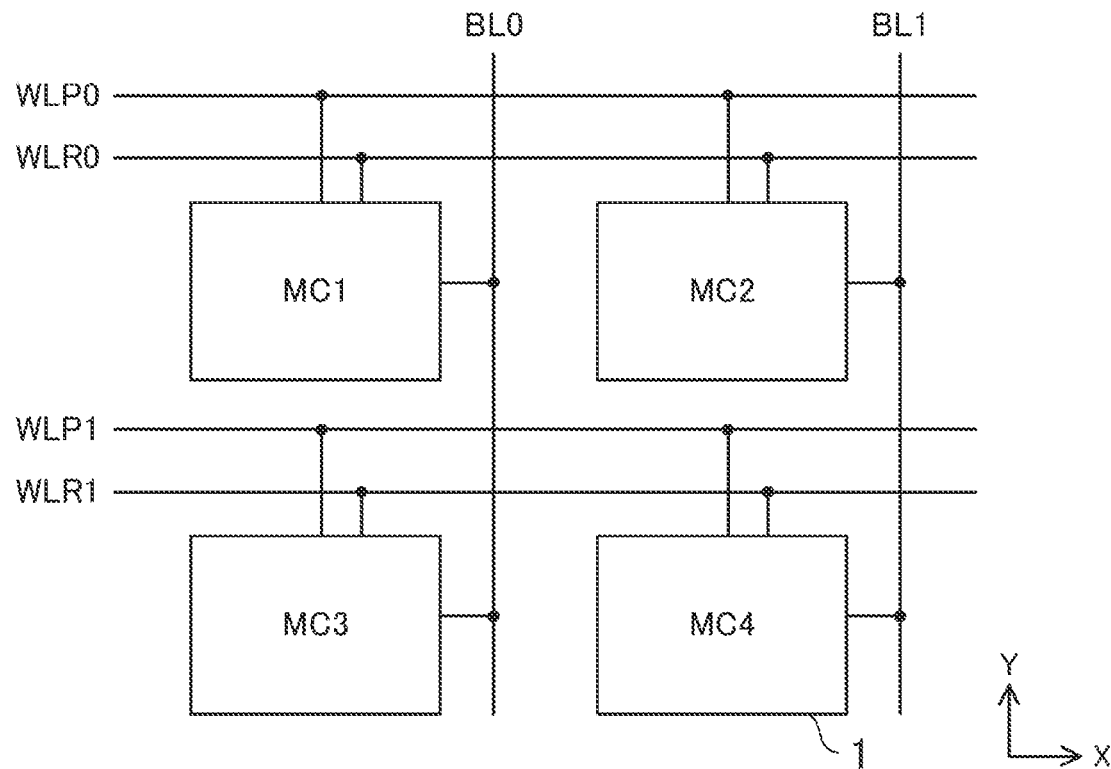
FIGS. 1A and 1B show an configuration example of a semiconductor storage device according to the first embodiment, where
Figure 1B:
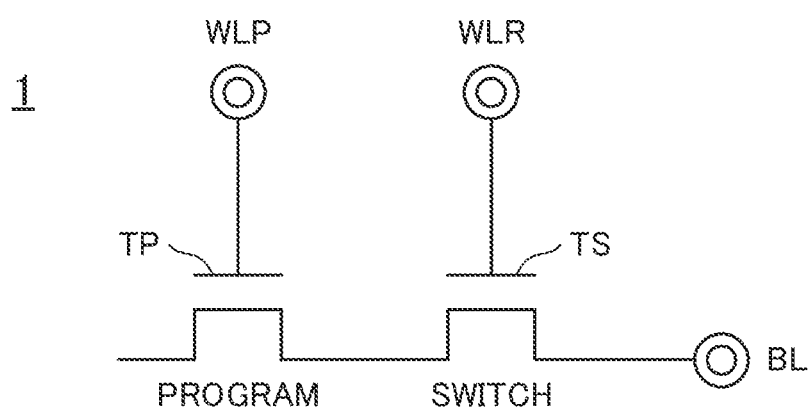

FIGS. 1A and 1B are views showing a configuration example of a semiconductor storage device provided with nonvolatile memory cells according to the first embodiment, where FIG. 1A is a block diagram of a memory cell array and FIG. 1B is a circuit diagram of a memory cell. As shown in FIG. 1A, each memory cell 1 is connected with its corresponding first word line WLP (indicated as WLPi (i is an integer) as appropriate), second word line WLR (indicated as WLRi (i is an integer) as appropriate), and bit line BL (indicated as BLi (i is an integer) as appropriate). Note that, although the semiconductor storage device is provided with, not only the memory cell array, but also peripheral circuits such as a write circuit and a read circuit, illustration of such circuits is omitted here. Note also that, although the memory cell array includes (2×2) memory cells 1 (MC1 to MC4) in FIG. 1A for simplification of the illustration, the numbers of memory cells 1 in an X direction (direction in which the first and second word lines WLP and WLR extend in this embodiment) and in a Y direction (direction in which the bit lines BL extend in this embodiment) are not limited to these.

In this embodiment, the memory cells 1 are one time programmable (OTP) memory cells of a gate oxide film breakdown type. As shown in FIG. 1B, each memory cell 1 includes serially-connected n-type transistors TP and TS. The transistor TP is a program element, of which the gate is connected to the first word line WLP. The program element stores a value "1"/"0" depending on the breakdown/non-breakdown state of the gate oxide film. The transistor TS is a switch element, of which the gate is connected to the second word line WLR. The switch element controls the access from the bit line BL to the program element. Here, the switch element and the program element are each constituted by a transistor having a gate oxide film thickness of the same level as that of a so-called core transistor in an internal circuit of a semiconductor integrated circuit, for example.

The write operation of the memory cell 1 is performed in the following manner. A high voltage VPP that is to be a write voltage is applied to a desired first word line WLP. The high voltage VPP is a voltage higher than the withstand voltage of the gate oxide film of the program element, which is 3 V, for example. Also, a voltage VPR is applied to the second word line WLR. The voltage VPR is a voltage lower than the withstand voltage of the gate oxide film of the switch element and also a voltage determined so that the voltage (VPP−VPR) be lower than the withstand voltage of the gate oxide film of the switch element, which is 1 V, for example. Also, 0 V is given to a bit line BL connected to a memory cell 1 in which breakdown of the gate oxide film is intended, and the voltage VPR is applied to a bit line BL connected to a memory cell 1 in which no breakdown of the gate oxide film is intended. As a result, in the memory cell 1 connected to the bit line BL to which 0 V has been given, the switch element becomes conductive and the gate oxide film of the program element is broken under the application of the high voltage VPP.

The read operation of the memory cell 1 is performed in the following manner. The bit line BL is precharged to 0 V, for example. A voltage VRR lower than the high voltage VPP is applied to desired first and second word lines WLP and WLR. The voltage VRR is a voltage causing no breakdown of the gate oxide film of the program element, which is 1 V, for example. At this time, when the gate oxide film of the program element has been broken, a current flows from the first word line WLP to the bit line BL through the gate of the program element, causing a rise in the potential of the bit line BL. On the other hand, when the gate oxide film of the program element has not been broken, the potential of the bit line BL remains unchanged. From this difference in potential, the state of the memory cell 1, i.e., a value "0" or "1" is read.

FIGS. 2A-2B and 3A-3C are views showing an example of a layout structure of a memory cell according to the first embodiment, where FIGS. 2A-2B are plan views of the memory cell, and FIGS. 3A-3C are cross-sectional views of the memory cell taken in the vertical direction as viewed in plan. Specifically, FIG. 2A shows an upper part, i.e., a portion including a three-dimensional transistor formed away from a substrate (an n-type nanowire FET in the illustrated example), and FIG. 2B shows a lower part, i.e., a portion including a three-dimensional transistor formed closer to the substrate (an n-type nanowire FET in the illustrated example). FIG. 3A shows a cross section taken along line Y1-Y1', FIG. 3B shows a cross section taken along line Y2-Y2', and FIG. 3C shows a cross section taken along line Y3-Y3'.

In the following description, in the plan views such as FIGS. 2A-2B, the horizontal direction in the figure is called the X direction (corresponding to the first direction), the vertical direction in the figure is called the Y direction (corresponding to the second direction), and the direction vertical to the substrate plane is called the Z direction (corresponding to the depth direction). Note that the X direction is a direction in which gate interconnects and word lines extend and the Y direction is a direction in which nanowires and bit lines extend. That is, in the drawings for this and subsequent embodiments, the X and Y directions are reversed from those in FIGS. 27 to 30. The thin solid lines running horizontally and vertically in the plan views such as FIGS. 2A-2B and the dotted lines running vertically in the cross-sectional views such as FIGS. 3A-3C represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

FIGS. 2A-2B and 3A-3C correspond to the layout of two memory cells MC1 and MC2 lying side by side in the horizontal direction in the block diagram of FIG. 1A. The memory cell MC1 connected to a bit line BL0 is formed in the upper part shown in FIG. 2A, and the memory cell MC2 connected to a bit line BL1 is formed in the lower part shown in FIG. 2B. In FIGS. 2A-2B, the broken line defines the bounds of the memory cell. This also applies in the subsequent plan views.

As shown in FIG. 2B, power supply lines 11 and 12 extending in the Y direction are provided. The power supply lines 11 and 12 are both buried power rails (BPRs) formed in a buried interconnect layer. The power supply lines 11 and 12 both supply the power supply voltage VSS.

As shown in FIG. 2A, interconnects 61 and 62 extending in the Y direction are formed in an M1 interconnect layer. The M1 interconnect 61 corresponds to the bit line BL0 and the M1 interconnect 62 corresponds to the bit line BL1.

Nanowires 21a and 21b extending in the Y direction are formed in the lower part of the memory cell, and nanowires 26a and 26b extending in the Y direction are formed in the upper part of the memory cell. The nanowires 21a and 26a overlap each other as viewed in plan, and the nanowires 21b and 26b overlap each other as viewed in plan. Pads 22a, 22b, and 22c doped with an n-type semiconductor are formed at the upper end of the nanowire 21a, between the nanowires 21a and 21b, and at the lower end of the nanowire 21b as viewed in the figure. Pads 27a, 27b, and 27c doped with an n-type semiconductor are formed at the upper end of the nanowire 26a, between the nanowires 26a and 26b, and at the lower end of the nanowire 26b as viewed in the figure.

That is, in the memory cell MC1 in the upper part, the nanowire 26a constitutes the channel portion of the transistor TS, and the pads 27a and 27b constitute the nodes of the transistor TS. The nanowire 26b constitutes the channel portion of the transistor TP, and the pads 27b and 27c constitute the nodes of the transistor TP. The pad 27b is shared by the transistors TS and TP. In the memory cell MC2 in the lower part, the nanowire 21a constitutes the channel portion of the transistor TS, and the pads 22a and 22b constitute the nodes of the transistor TS. The nanowire 21b constitutes the channel portion of the transistor TP, and the pads 22b and 22c constitute the nodes of the transistor TP. The pad 22b is shared by the transistors TS and TP.

Gate interconnects 31 and 32 extend in the X direction and also extend in the Z direction over the lower and upper parts of the memory cell. The gate interconnect 31 is to be the gates of the transistors TS of the memory cells MC1 and MC2, and the gate interconnect 32 is to be the gates of the transistors TP of the memory cells MC1 and MC2. The gate interconnect 31 is connected to the word line WLR0, and the gate interconnect 32 is connected to the word line WLP0.

In the lower part of the memory cell, local interconnects 41 and 42 extending in the X direction are formed. The local interconnect 41 is connected with the pad 22a and extends rightward from the pad 22a in the figure. The local interconnect 42 is connected with the pad 22c and extends rightward from the pad 22c in the figure. In the upper part of the memory cell, local interconnects 43 and 44 extending in the X direction are formed. The local interconnect 43 is connected with the pad 27a and extends leftward from the pad 27a in the figure. The local interconnect 44 is connected with the pad 27c and extends leftward from the pad 27c in the figure. The local interconnect 41 is connected with the M1 interconnect 62 through a contact 51, and the local interconnect 43 is connected with the M1 interconnect 61 through a contact 52.

Figure 4:
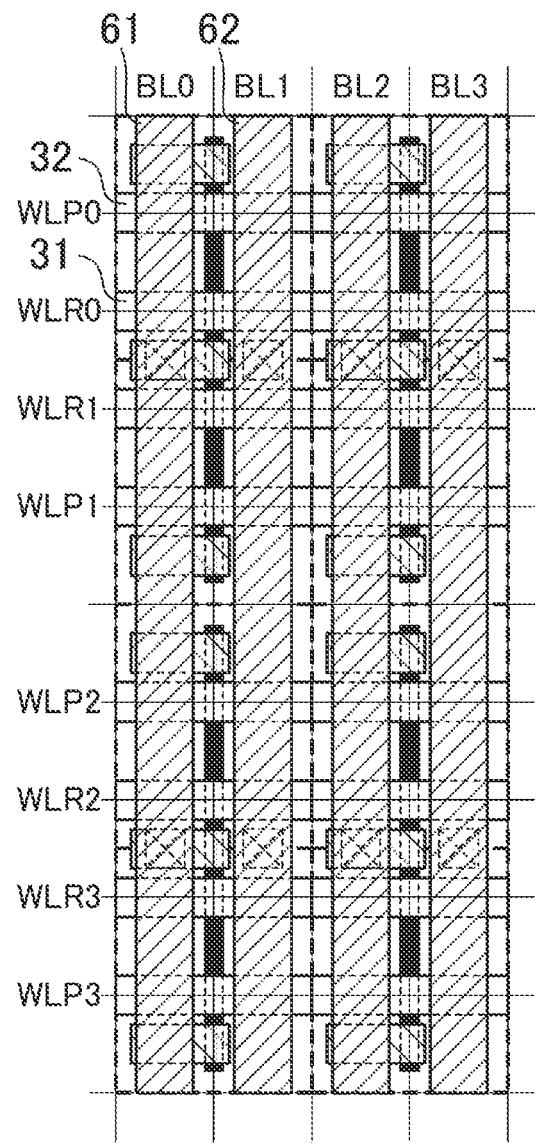
FIG. 4 shows a layout structure of an upper part of a memory cell array using the memory cell of FIGS. 2A-2B and 3A-3C.

FIGS. 4 and 5 are views showing a layout structure of a memory cell array using the memory cell of FIGS. 2A-2B and 3A-3C, where FIG. 4 shows an upper part and FIG. 5 shows a lower part. FIGS. 4 and 5 show a configuration in which memory cells, using the memory cell of FIGS. 2A-2B, are arranged in an array of two in the X direction and four in the Y direction. The memory cells are inverted in the Y direction every other row in the Y direction.

The gate interconnects 31, shown in the memory cell of FIGS. 2A-2B, extend in the X direction, constituting word lines WLR0 to WLR3. The gate interconnects 32, shown in the memory cell of FIGS. 2A-2B, extend in the X direction, constituting word lines WLP0 to WLP3. The M1 interconnects 61, shown in the memory cell of FIGS. 2A-2B, extend in the Y direction, constituting bit lines BL0 and BL2. The M1 interconnects 62, shown in the memory cell of FIGS. 2A-2B, extend in the Y direction, constituting bit lines BL1 and BL3. Between the word lines WLR0 and WLR1, the drains are shared by the adjacent transistors TS, and between the word lines WLR2 and WLR3, the drains are shared by the adjacent transistors TS.

As described above, according to this embodiment, the memory cell shown in FIGS. 2A-2B and 3A-3C implements an OTP memory of one bit in the upper part and also implements an OTP memory of one bit in the lower part. The channel portions 21$b$ and 26$b$ of the transistors TP that are to be the program elements overlap each other as viewed in plan, and the channel portions 21$a$ and 26$a$ of the transistors TS that are to be the switch elements overlap each other as viewed in plan. Therefore, a small-area layout structure can be implemented for the OTP memory cell.

Also, in the memory cell array, the transistors TS of memory cells adjacent in the Y direction can share the drain. This realizes reduction in the area of the semiconductor storage device.

Figure 6:
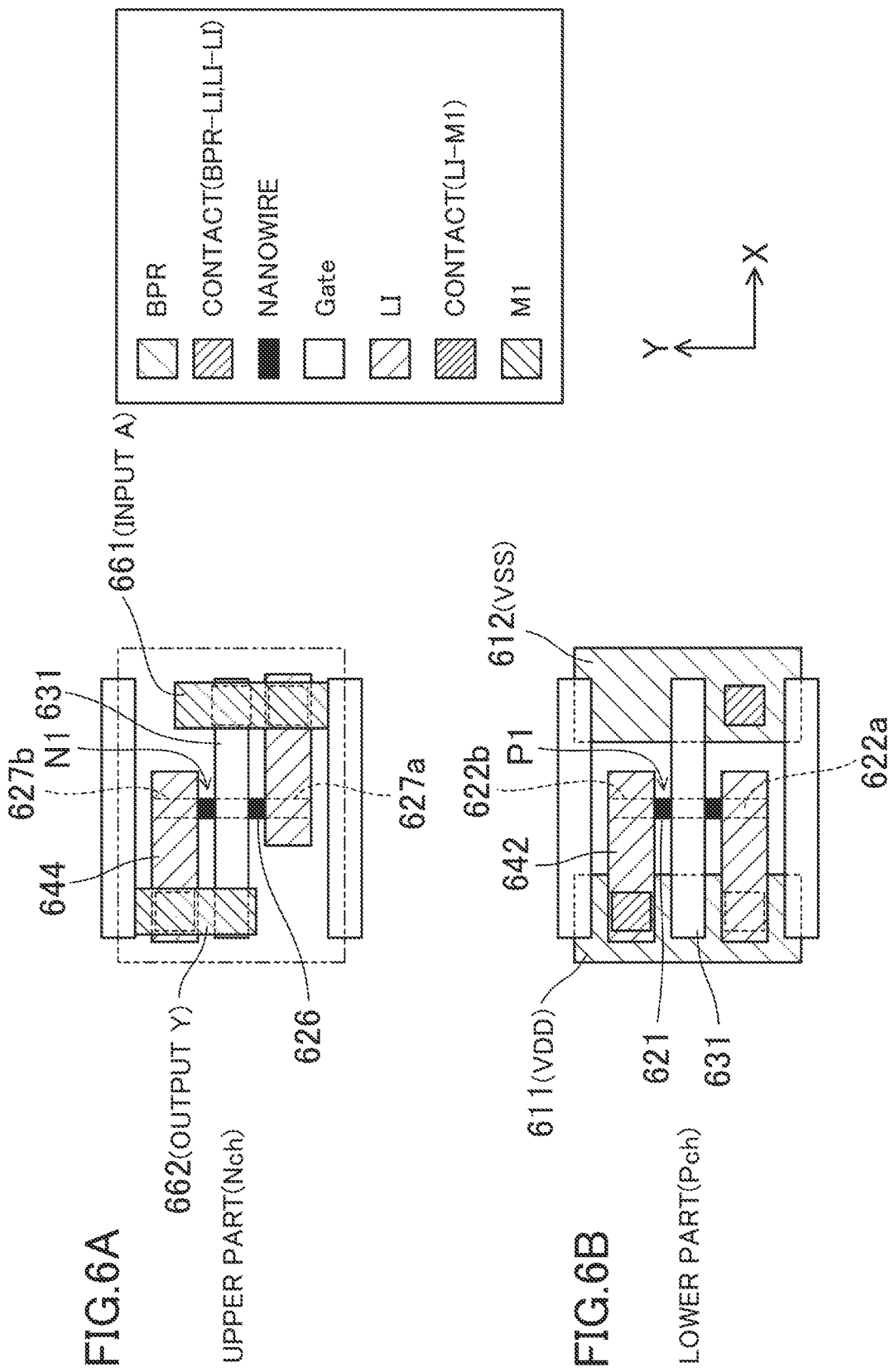
FIGS. 6A and 6B are plan views showing a layout structure example of an inverter cell using a CFET.

In a general CFET, the upper and lower transistors are different in conductivity type. FIGS. 6A-6B show a layout structure of an inverter cell using a CFET. A transistor N1 in the upper part shown in FIG. 6A is an n-type transistor, and a transistor P1 in the lower part shown in FIG. 6B is a p-type transistor. The transistor P1 and the transistor N1 are connected in series between a power supply line 611 supplying VDD and a power supply line 612 supplying VSS. The transistor P1 has a nanowire 621 that is to be a channel portion and pads 622$a$ and 622$b$, and the transistor N1 has a nanowire 626 that is to be a channel portion and pads 627$a$ and 627$b$. A gate interconnect 631 is to be the common gate of the transistor P1 and the transistor N1. An M1 interconnect 661 that is to be the input of the inverter is connected with the gate interconnect 631. An M1 interconnect 662 that is to be the output of the inverter is connected with local interconnects 642 and 644 connected with the drains of the transistor P1 and the transistor N1.

On the contrary, in the OTP memory cell according to this embodiment, both transistors in the upper and lower parts are n-type transistors. That is, a semiconductor chip having the OTP memory cell of this embodiment includes a region where the lower part of a CFET is a p-type transistor and a region where it is an n-type transistor. In such a semiconductor chip, transistors in the lower part may be manufactured in the following manner, for example. That is, at the time of formation of transistors in the lower part, the portion for n-type transistors is masked to dope the other portion into p-type conductivity. Thereafter, the portion other than the portion for n-type transistors is masked to dope the portion for n-type transistors into n-type conductivity. By placing n-type transistors and p-type transistors away from each other, the p-type doping and the n-type doping can be performed without fail.

(Diversion to Mask ROM)

Figure 7:
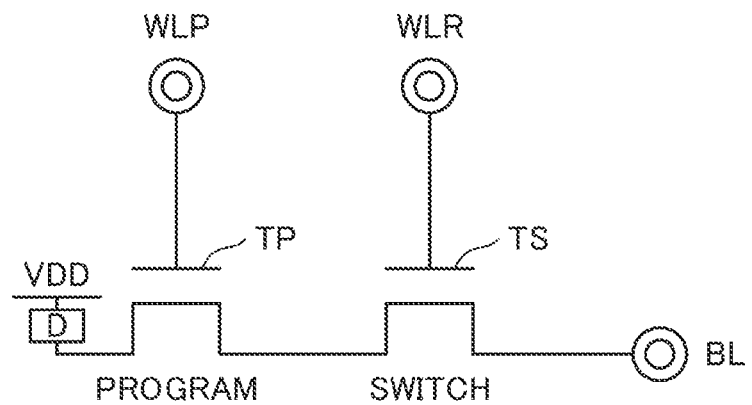
FIG. 7 is a circuit diagram of a mask ROM cell diverted from an OTP memory cell.

The above-described OTP memory cell can be easily diverted to a mask ROM cell. FIG. 7 is a circuit diagram of a mask ROM cell diverted from the OTP memory cell. In the OTP memory cell shown in FIG. 1B, the storage value is prescribed by the presence or absence of breakdown of the gate oxide film of the transistor TP as the program element. On the contrary, in the mask ROM cell shown in FIG. 7, a prescribed value is stored depending on the presence or absence of connection between the source of the transistor TP and the power supply VDD (position "D" in FIG. 7). The presence or absence of connection is realized by the presence or absence of a contact or a via, for example.

The data read of the mask ROM cell shown in FIG. 7 is performed in the following manner. The bit line BL is precharged to a low level. In this state, a high level is applied to both the word lines WLP and WLR. When the source of the transistor TP is connected with the power supply VDD, the bit line BL changes to a high level. On the contrary, when the source of the transistor TP is not connected with the power supply VDD, the bit line BL remains low. From the difference in the potential of the bit line BL, the state of the mask ROM cell, i.e., a value "0" or "1" is read.

FIGS. 8A-8B are plan views showing an example of a layout structure of a mask ROM cell diverted from the OTP memory cell, where FIG. 8A shows an upper part and FIG. 8B shows a lower part. The layout structure of FIGS. 8A-8B is basically the same as that of FIGS. 2A-2B. In FIGS. 8A-8B, the presence or absence of contacts 53 and 54 determines the storage value of the mask ROM cell. Note that in the figures illustrating mask ROM cells, contacts determining storage values are marked with the letter "D". The contact 53 connects the local interconnect 44 and the power supply line 11 when formed. That is, by the presence or absence of the contact 53, connection or disconnection between the pad 27$c$, which is to be the source of the transistor TP in the upper part, and the power supply VDD is determined. The contact 54 connects the local interconnect 42 and the power supply line 12 when formed. That is, by the presence or absence of the contact 54, connection or disconnection between the pad 22$c$, which is to be the source of the transistor TP in the lower part, and the power supply VDD is determined.

In the OTP memory cell of FIGS. 2A-2B, the power supply lines 11 and 12 and the local interconnects 42 and 44 are provided for easy diversion to the mask ROM cell. When no consideration for such diversion to the mask ROM cell is necessary, however, the power supply lines 11 and 12 and the local interconnects 42 and 44 may be omitted.

In the layout structure of FIGS. 8A-8B, the contact 53 is long in shape formed over the upper and lower parts. Instead, a local interconnect connected with the local interconnect 44 may be formed in the lower part at the position of the contact 53. In this case, as the contact determining the storage value, a contact connecting the local interconnect in the lower part and the power supply line 11 may be formed, in place of the contact 53. With this configuration, the storage values of the mask ROM cells in the upper and lower parts can be determined by only the presence or absence of the contacts in the lower part.

(Alteration 1)

FIGS. 9A-9D are plan views showing layout structures of memory cells according to Alteration 1 of this embodiment, where FIGS. 9A and 9B show upper and lower parts, respectively, of an OTP memory cell and FIGS. 9C and 9D show upper and lower parts, respectively, of a mask ROM cell.

In the layout structures of FIGS. 9A-9D, in comparison with those in FIGS. 2A-2B and 8A-8B, each of the local interconnects connected with the sources of the transistors TP as the program elements extends in the opposite direction. That is, in the memory cell in each lower part, a local interconnect 42A connected to the pad 22$c$ that is to be the source of the transistor TP extends leftward from the pad 22$c$ in the figure. In the memory cell in each upper part, a local interconnect 44A connected to the pad 27$c$ that is to be the source of the transistor TP extends rightward from the pad 27c in the figure. With this, the positions of contacts 53A and 54A for determining the storage values of the mask ROM cells are different from the contact positions in FIGS. 8A-8B. The other configuration is similar to that of the above-described embodiment.

(Alteration 2)

FIGS. 10A-10B are plan views showing a layout structure of a memory cell according to Alteration 2 of this embodiment, where FIG. 10A shows an upper part and FIG. 10B shows a lower part. In FIGS. 10A-10B, components in common with those in FIGS. 2A-2B are denoted by the same reference characters, and detailed description thereof may be omitted here.

In the layout structure of FIGS. 10A-10B, the sources of the transistors TP as the program elements are deleted. Specifically, the pads 22c and 27c and the local interconnects 42 and 44 in the layout structure of FIGS. 2A-2B are omitted. Also, the power supply lines 11 and 12 are omitted. This reduces the area of the memory cell compared with the layout structure of FIGS. 2A-2B.

FIGS. 11 and 12 are views showing a layout structure of a memory cell array using the memory cell of FIGS. 10A-10B, where FIG. 11 shows an upper part and FIG. 12 shows a lower part. FIGS. 11 and 12 show a configuration in which memory cells, using the memory cell of FIGS. 10A-10B, are arranged in an array of two in the X direction and four in the Y direction. The memory cells are inverted in the Y direction every other row in the Y direction.

In the OTP memory cell, the transistor TP is only required to have a channel portion and a gate surrounding the channel portion for storing data. Omitting the source will therefore cause no problem in the operation. Also, in this alteration, it is not supposed to divert the OTP memory cell to a mask ROM cell. Therefore, by omitting the pads 22c and 27c that are to be the sources of the transistors TP, the local interconnects 42 and 44, and the power supply lines 11 and 12, as in the layout structure of FIGS. 10A-10B, a small-area memory cell can be implemented.

(Alteration 3)

FIGS. 13A-13D are plan views showing layout structures of memory cells according to Alteration 3 of this embodiment, where FIGS. 13A and 13B show upper and lower parts, respectively, of an OTP memory cell and FIGS. 13C and 13D show upper and lower parts, respectively, of a mask ROM cell.

In the layout structures of FIGS. 13A-13D, in comparison with those in FIGS. 2A-2B and 8A-8B, the positions of the pads to which local interconnects are connected are different. That is, in the memory cell in each lower part, a local interconnect 45 is connected to the pad 22b shared by the transistors TS and TP, and in the memory cell in each upper part, a local interconnect 46 is connected to the pad 27b shared by the transistors TS and TP. The local interconnect 45 extends rightward from the pad 22b in the figure, and the local interconnect 46 extends leftward from the pad 27b in the figure. Also, as in Alteration 2, the pads 22c and 27c that are to be the sources of the transistors TP and the local interconnects 42 and 44 are omitted. This reduces the area of the memory cell compared with the layout structures of FIGS. 2A-2B and 8A-8B.

Figure 14:
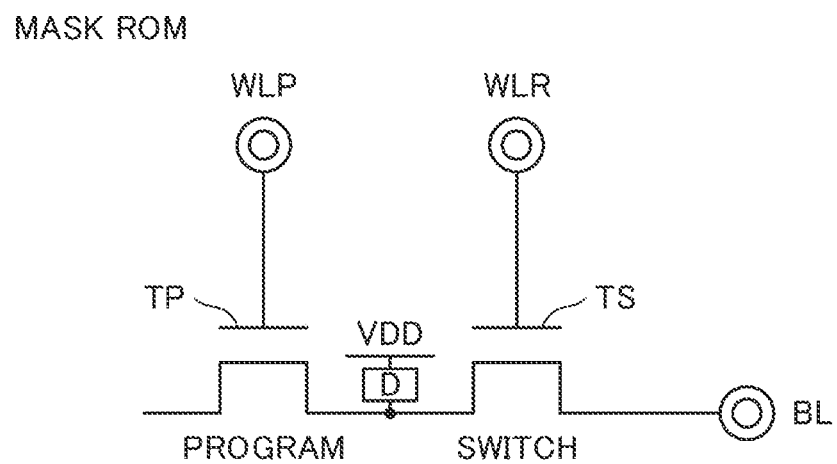
FIG. 14 is a circuit diagram of the mask ROM cell according to Alteration 3 of the first embodiment.

As shown in FIG. 14, in the mask ROM cell according to this alteration, a prescribed value is stored depending on the presence or absence of connection between the node connecting the transistor TP and the transistor TS and the power supply VDD. As shown in FIGS. 13C-13D, contacts 55 and 56 determining the storage values of the mask ROM cell are formed at positions on the local interconnects 45 and 46.

That is, the contact 55 connects the local interconnect 45 and the power supply line 12 when formed, and the contact 56 connects the local interconnect 46 and the power supply line 11 when formed.

FIGS. 15 and 16 are views showing a layout structure of a memory cell array using the memory cell of FIGS. 13A-13B, where FIG. 15 shows an upper part and FIG. 16 shows a lower part. FIGS. 15 and 16 show a configuration in which memory cells, using the memory cell of FIGS. 13A-13B, are arranged in an array of two in the X direction and four in the Y direction. The memory cells are inverted in the Y direction every other row in the Y direction.

In this alteration, each of the local interconnects 45 and 46 may extend in the opposite direction. That is, the local interconnect 45 may extend leftward from the pad 22b in the figure, and the local interconnect 46 may extend rightward from the pad 27b in the figure.

Second Embodiment

Figure 17A:
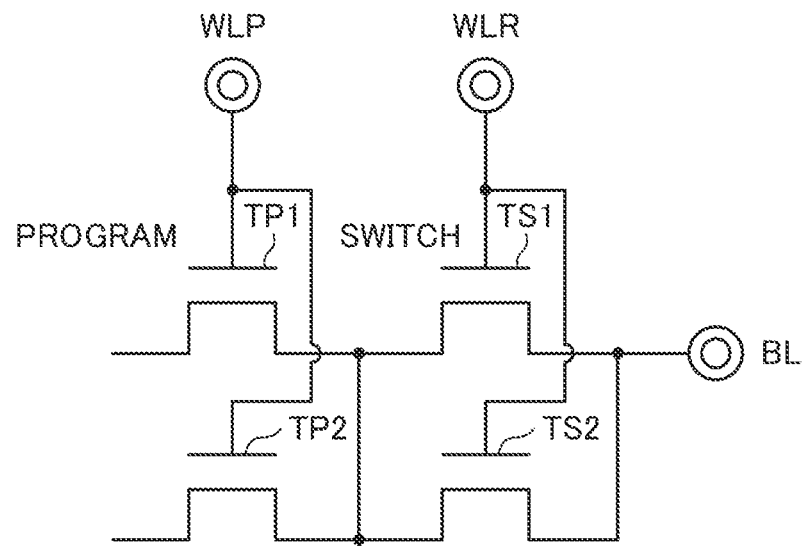
FIGS. 17A and 17B are circuit diagrams of memory cells in a semiconductor storage device according to the second embodiment, where
Figure 17B:
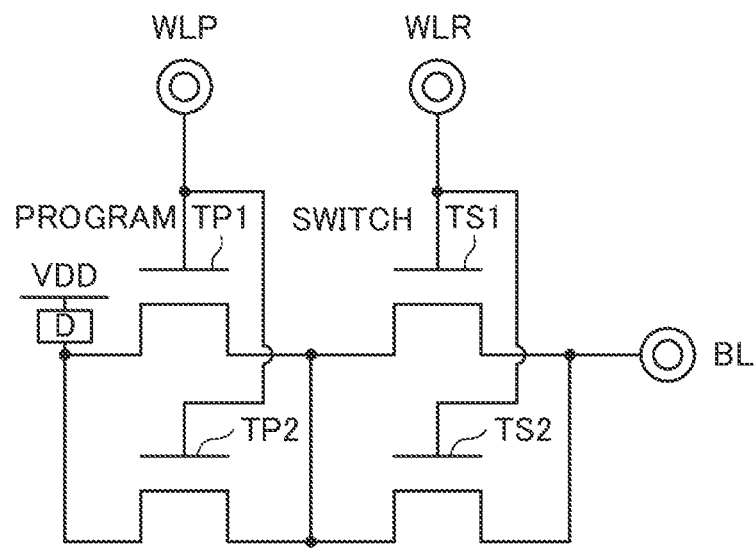

FIGS. 17A-17B are circuit diagrams of memory cells in a semiconductor storage device according to the second embodiment, where FIG. 17A shows an OTP memory and FIG. 17B shows a mask ROM diverted from the OTP memory. The configuration of a memory cell array in this embodiment is similar to that of the memory cell array according to the first embodiment shown in FIG. 1A.

As is found from FIGS. 17A-17B, in this embodiment, the switch element and the program element are each constituted by two transistors. That is, the switch element includes n-type transistors TS1 and TS2 connected in parallel, and the program element includes n-type transistors TP1 and TP2 connected in parallel. The gates of the transistors TP1 and TP2 are connected to a first word line WLP, and the gates of the transistors TS1 and TS2 are connected to a second word line WLR.

The program element provided with two transistors TP1 and TP2 has the following merits. Even when data write, i.e., breakdown of the gate oxide film has not been sufficiently done in one transistor, the potential of the bit line BL can be changed by the other transistor, whereby stored data can be read correctly. Also, since the drive capability of the transistors is great compared with the case of the first embodiment, read operation can be performed at high speed. Note that the switch element may otherwise be constituted by one transistor.

FIGS. 18A-18D are plan views showing layout structures of memory cells according to this embodiment, where FIGS. 18A and 18B show upper and lower parts, respectively, of an OTP memory cell and FIGS. 18C and 18D show upper and lower parts, respectively, of a mask ROM cell. Note that the layout structure of the mask ROM cell shown in FIGS. 18C and 18D is basically similar to that of the OTP memory cell shown in FIGS. 18A and 18B, and therefore reference characters for common components are omitted in FIGS. 18C and 18D. Note also that, since the cross-sectional structure in this embodiment can be easily inferred by analogy from the layout structure in the first embodiment, illustration thereof is omitted here.

First, referring to FIGS. 18A and 18B, the layout structure of the OTP memory cell according to this embodiment will be described. FIGS. 18A and 18B correspond to the layout of the memory cell MC1 on the upper left in the block diagram of FIG. 1A. The transistors TP2 and TS2 are formed in the upper part shown in FIG. 18A, and the transistors TP1 and TS1 are formed in the lower part shown in FIG. 18B.

As shown in FIG. 18A, interconnects 161 and 162 extending in the Y direction are formed in an M1 interconnect layer. The M1 interconnect 161 corresponds to the bit line BL0 and the M1 interconnect 162 supplies the power supply voltage VDD.

Nanowires 121a and 121b extending in the Y direction are formed in the lower part of the memory cell, and nanowires 126a and 126b extending in the Y direction are formed in the upper part of the memory cell. The nanowires 121a and 126a overlap each other as viewed in plan, and the nanowires 121b and 126b overlap each other as viewed in plan. Pads 122a, 122b, and 122c doped with an n-type semiconductor are formed at the upper end of the nanowire 121a, between the nanowires 121a and 121b, and at the lower end of the nanowire 121b as viewed in the figure. Pads 127a, 127b, and 127c doped with an n-type semiconductor are formed at the upper end of the nanowire 126a, between the nanowires 126a and 126b, and at the lower end of the nanowire 126b as viewed in the figure.

That is, in the lower part, the nanowire 121a constitutes the channel portion of the transistor TS1, and the pads 122a and 122b constitute the nodes of the transistor TS1. The nanowire 121b constitutes the channel portion of the transistor TP1, and the pads 122b and 122c constitute the nodes of the transistor TP1. The pad 122b is shared by the transistors TS1 and TP1. In the upper part, the nanowire 126a constitutes the channel portion of the transistor TS2, and the pads 127a and 127b constitute the nodes of the transistor TS2. The nanowire 126b constitutes the channel portion of the transistor TP2, and the pads 127b and 127c constitute the nodes of the transistor TP2. The pad 127b is shared by the transistors TS2 and TP2.

Gate interconnects 131 and 132 extend in the X direction and also extend in the Z direction over the lower and upper parts of the memory cell. The gate interconnect 131 is to be the gates of the transistors TS1 and TS2, and the gate interconnect 132 is to be the gates of the transistors TP1 and TP2. The gate interconnect 131 is connected to the word line WLR0, and the gate interconnect 132 is connected to the word line WLP0.

In the lower part of the memory cell, local interconnects 141, 142, and 143 extending in the X direction are formed. The local interconnect 141 is connected with the pad 122a and extends leftward from the pad 122a in the figure. The local interconnect 142 is connected with the pad 122b and extends leftward from the pad 122b in the figure. The local interconnect 143 is connected with the pad 122c and extends rightward from the pad 122c in the figure. In the upper part of the memory cell, local interconnects 144, 145, and 146 extending in the X direction are formed. The local interconnect 144 is connected with the pad 127a and extends leftward from the pad 127a in the figure. The local interconnect 145 is connected with the pad 127b and extends leftward from the pad 127b in the figure. The local interconnect 146 is connected with the pad 127c and extends rightward from the pad 127c in the figure.

The local interconnects 141 and 144 overlap each other as viewed in plan and are mutually connected through a contact 151. The local interconnects 142 and 145 overlap each other as viewed in plan and are mutually connected through a contact 152. The local interconnects 143 and 146 overlap each other as viewed in plan and are mutually connected through a contact 153. Also, the local interconnect 144 is connected with the M1 interconnect 161 through a contact 155.

That is, according to the layout structure of this embodiment, in the transistors TP1 and TP2 constituting the program element, the channel portions overlap each other as viewed in plan, the respective nodes are mutually connected, and the gate is shared. In the transistors TS1 and TS2 constituting the switch element, the channel portions overlap each other as viewed in plan, the respective nodes are mutually connected, and the gate is shared.

FIGS. 19 and 20 are views showing a layout structure of a memory cell array using the memory cell of FIGS. 18A-18B, where FIG. 19 shows an upper part and FIG. 20 shows a lower part. FIGS. 19 and 20 show a configuration in which memory cells, using the memory cell of FIGS. 18A-18B, are arranged in an array of two in the X direction and four in the Y direction. The memory cells are inverted in the Y direction every other row in the Y direction.

The gate interconnects 131, shown in the memory cell of FIGS. 18A-18B, extend in the X direction, constituting word lines WLR0 to WLR3. The gate interconnects 132, shown in the memory cell of FIGS. 18A-18B, extend in the X direction, constituting word lines WLP0 to WLP3. The M1 interconnects 161, shown in the memory cell of FIGS. 18A-18B, extend in the Y direction, constituting bit lines BL0 and BL1. The M1 interconnects 162, shown in the memory cell of FIGS. 18A-18B, extend in the Y direction, to supply the power supply voltage VDD. Between the word lines WLR0 and WLR1, the drains are shared by the adjacent transistors TS1 or TS2. Between the word lines WLR2 and WLR3, the drains are shared by the adjacent transistors TS1 or TS2.

The OTP memory cell shown in FIGS. 18A and 18B can be easily diverted to a mask ROM cell. That is, as shown in FIGS. 18C and 18D, a contact 156 determines the storage value of the memory cell by its presence or absence. The contact 156 connects the local interconnect 146 and the M1 interconnect 162 when formed. That is, connection or disconnection of the pad 122c, which is to be the source of the transistor TP1, and the pad 127c, which is to be the source of the transistor TP2, with the power supply VDD is determined by the presence or absence of the contact 156.

As described above, according to this embodiment, in the memory cells shown in FIGS. 18A-18D, the program element has two transistors TP1 and TP2, and the switch element has two transistors TS1 and TS2. Therefore, even when data write, i.e., breakdown of the gate oxide film has not been sufficiently done in one of the transistors TP1 and TP2, the signal of the bit line BL can be changed by the other transistor, whereby stored data can be read correctly. Also, speedup of the read operation becomes possible. Moreover, the channel portions 121b and 126b of the transistors TP1 and TP2 that are to be the program element overlap each other as viewed in plan, and the channel portions 121a and 126a of the transistors TS1 and TS2 that are to be the switch element overlap each other as viewed in plan. Therefore, a small-area layout structure can be implemented for the OTP memory cell.

If the transistor characteristics vary between the upper part and the lower part, characteristics may vary every bit line in the first embodiment. On the contrary, this embodiment is free from the influence of such variations. Also, since lines for supplying the power supply voltage VDD are disposed between the bit lines, crosstalk noise between bit lines can be suppressed. This leads to stability of the operation. Moreover, in this embodiment, the storage value of the mask ROM cell can be set using only a contact in one layer in the upper part. This can also shorten the manufacturing time for changing the storage value of the memory cell.

While the pad 122b that is to be the mid node of the transistors TP1 and TS1 and the pad 127b that is to be the mid node of the transistors TP2 and TS2 are mutually connected in the above-described layout structure, it is not necessarily required to connect the pads 122b and 127b. In this case, the local interconnects 142 and 145 and the contact 152 can be omitted.

As in the first embodiment, a BPR for supplying a power supply voltage may be provided, whereby the power supply can be strengthened. In this case, in the mask ROM cell, the storage value may be set by the presence or absence of a contact between the BPR and a local interconnect.

(Alteration 1)

FIGS. 21A-21B are plan views showing a layout structure of a memory cell according to Alteration 1 of this embodiment, where FIG. 21A shows an upper part and FIG. 21B shows a lower part. In FIGS. 21A-21B, components in common with those in FIGS. 18A-18B are denoted by the same reference characters, and detailed description thereof may be omitted here.

In the layout structure of FIGS. 21A-21B, the sources of the transistors TP1 and TP2 constituting the program element are deleted. Specifically, the pads 122c and 127c, the local interconnects 143 and 146, and the contact 153 in the layout structure of FIGS. 18A-18B are omitted. This reduces the area of the memory cell compared with the layout structure of FIGS. 18A-18B. Also, the M1 interconnect 162 that supplies the power supply voltage VDD is omitted.

FIGS. 22 and 23 are views showing a layout structure of a memory cell array using the memory cell of FIGS. 21A-21B, where FIG. 22 shows an upper part and FIG. 23 shows a lower part. FIGS. 22 and 23 show a configuration in which memory cells, using the memory cell of FIGS. 21A-21B, are arranged in an array of two in the X direction and four in the Y direction. The memory cells are inverted in the Y direction every other row in the Y direction.

As already described in Alteration 2 of the first embodiment, in the OTP memory cell, the transistors TP1 and TP2 are each only required to have a channel portion and a gate surrounding the channel portion for storing data. Omitting the source will therefore cause no problem in the operation. Also, in this alteration, it is not supposed to divert the OTP memory cell to a mask ROM cell. Therefore, by omitting the pads 122c and 127c that are to be the sources of the transistors TP1 and TP2, the local interconnects 143 and 146, and the M1 interconnect 162, as in the layout structure of FIGS. 21A-21B, a small-area memory cell can be implemented.

(Alteration 2)

FIGS. 24A-24D are plan views showing layout structures of memory cells according to Alteration 2 of this embodiment, where FIGS. 24A and 24B show upper and lower parts, respectively, of an OTP memory cell and FIGS. 24C and 24D show upper and lower parts, respectively, of a mask ROM cell.

In the layout structures of FIGS. 24A-24D, in comparison with those in FIGS. 18A-18D, the sources of the transistors TP1 and TP2 constituting the program element in each memory cell are omitted, as in Alteration 1 of this embodiment. Specifically, the pads 122c and 127c, the local interconnects 143 and 146, and the contacts 153 in the layout structures of FIGS. 18A-18D are omitted. This reduces the area of the memory cells, compared with the layout structures of FIGS. 18A-18D.

In addition, a local interconnect 145A connected to the pad 127b in each memory cell extends rightward and leftward from the pad 127b in the figure. A contact 157 that determines the storage value of the mask ROM cell is formed at a position where the local interconnect 145A and the M1 interconnect 162 overlap each other as viewed in plan. That is, the contact 157 connects the local interconnect 145A and the M1 interconnect 162 that supplies the power supply voltage VDD when formed. In the mask ROM cell according to this alteration, therefore, as in Alteration 3 of the first embodiment, a prescribed value is stored depending on the presence or absence of connection between the node, connecting the transistors TP1 and TP2 and the transistors TS1 and TS2, and the power supply VDD.

FIGS. 25 and 26 are views showing a layout structure of a memory cell array using the memory cell of FIGS. 24A-24B, where FIG. 25 shows an upper part and FIG. 25 shows a lower part. FIGS. 25 and 26 show a configuration in which memory cells, using the memory cell of FIGS. 24A-24B, are arranged in an array of two in the X direction and four in the Y direction. The memory cells are inverted in the Y direction every other row in the Y direction.

Other Examples

In the embodiments described above, while each transistor is assumed to have one nanowire, some or all transistors may have a plurality of nanowires. In this case, the plurality of nanowires may be arranged in the X direction as viewed in plan, or arranged in the Z direction. Alternatively, the plurality of nanowires may be arranged in both the X direction and the Z direction. The number of nanowires included in each transistor may be different between the upper and lower parts of the cell.

Also, in the above embodiments, while the cross-sectional shape of the nanowires is roughly square, it is not limited to this. For example, the shape may be circular or rectangular.

While the above embodiments have been described taking nanowire FETs as an example of three-dimensional transistors, the transistor type is not limited to this. For example, a fin transistor may be used as the transistor formed in the lower part of the cell.

According to the present disclosure, a small-area layout structure can be implemented for a semiconductor integrated circuit device provided with memory cells using CFETs. The present disclosure is therefore useful for improvement of the performance of a semiconductor chip, for example.

What is claimed is:

1. A semiconductor storage device provided with a nonvolatile memory cell, comprising:
   first and second word lines extending in a first direction; and
   first and second bit lines extending in a second direction perpendicular to the first direction,
   wherein
   the memory cell includes
      a first program transistor having a gate connected to the first word line,
      a first switch transistor, provided between the first program transistor and the first bit line, having a gate connected to the second word line,
      a second program transistor having a gate connected to the first word line, and
      a second switch transistor, provided between the second program transistor and the second bit line, having a gate connected to the second word line,
   the first and second program transistors are three-dimensional transistors of which channel portions overlap each other as viewed in plan, the first and second switch transistors are three-dimensional transistors of which channel portions overlap each other as viewed in plan, the first program transistor and the first switch transistor are formed in a first layer, the second program transistor and the second switch transistor are formed in a second layer located below the first layer, and the memory cell includes a first local interconnect that is connected to a drain of the first switch transistor and extends from the first switch transistor toward a first-oriented direction in the first direction.

2. The semiconductor storage device of claim 1, wherein the memory cell includes a second local interconnect that is connected to a drain of the second switch transistor and extends from the second switch transistor toward a direction opposite to the first-oriented direction in the first direction.

3. The semiconductor storage device of claim 2, wherein the memory cell includes a third local interconnect that is connected to a source of the first program transistor and extends from the first program transistor toward a second-oriented direction in the first direction, and a fourth local interconnect that is connected to a source of the second program transistor and extends from the second program transistor toward a direction opposite to the second-oriented direction in the first direction.

4. The semiconductor storage device of claim 3, wherein the first-oriented direction and the second-oriented direction are the same oriented direction.

5. The semiconductor storage device of claim 3, wherein the first-oriented direction and the second-oriented direction are the opposite oriented directions.

6. The semiconductor storage device of claim 3, further comprising:

first and second power supply lines extending in parallel in the second direction and supplying a first power supply voltage, wherein the third and fourth local interconnects have overlaps with the first and second power supply lines, respectively, as viewed in plan, and at least one of the third and fourth local interconnects is connected with the first or second power supply line through a contact.

7. The semiconductor storage device of claim 2, wherein the memory cell includes a third local interconnect that is connected to a node shared by the first program transistor and the first switch transistor and extends in the first direction, and a fourth local interconnect that is connected to a node shared by the second program transistor and the second switch transistor and extends in the first direction.

8. The semiconductor storage device of claim 7, further comprising:

first and second power supply lines extending in parallel in the second direction and supplying a first power supply voltage, wherein the third and fourth local interconnects have overlaps with the first and second power supply lines, respectively, as viewed in plan, and at least one of the third and fourth local interconnects is connected with the first or second power supply line through a contact.

9. A semiconductor storage device provided with a non-volatile memory cell, comprising:

first and second word lines extending in a first direction; and a first bit line extending in a second direction perpendicular to the first direction, wherein the memory cell includes a first program element having a gate connected to the first word line, and a first switch element, provided between the first program element and the first bit line, having a gate connected to the second word line, the first program element has first and second program transistors that are three-dimensional transistors connected in parallel of which channel portions overlap each other as viewed in plan, and the first switch element includes a first switch transistor that is a three-dimensional transistor formed in a same layer as either one of the first and second program transistors.

10. The semiconductor storage device of claim 9, wherein the first switch element includes a second switch transistor that is a three-dimensional transistor of which a channel portion overlaps a channel portion of the first switch transistor as viewed in plan, the first program transistor and the first switch transistor are formed in a first layer, and the second program transistor and the second switch transistor are formed in a second layer located below the first layer.

11. The semiconductor storage device of claim 10, wherein the memory cell includes a first local interconnect that is connected to a drain of the first switch transistor and extends from the first switch transistor toward a first-oriented direction in the first direction, a second local interconnect that is connected to a drain of the second switch transistor and extends from the second switch transistor toward the first-oriented direction in the first direction, a third local interconnect that is connected to a node shared by the first program transistor and the first switch transistor and extends in the first direction, and a fourth local interconnect that is connected to a node shared by the second program transistor and the second switch transistor and extends in the first direction, the first and second local interconnects are mutually connected through a contact, and the third and fourth local interconnects are mutually connected through a contact.

12. The semiconductor storage device of claim 11, further comprising:

a first power supply line extending in the second direction and supplying a first power supply voltage, wherein the third and fourth local interconnects have overlaps with the first power supply line as viewed in plan, and either of the third and fourth local interconnects is connected with the first power supply line through a contact.

13. The semiconductor storage device of claim 11, wherein
the memory cell includes
a fifth local interconnect that is connected to a source of the first program transistor and extends from the first program transistor toward a second-oriented direction in the first direction, and
a sixth local interconnect that is connected to a source of the second program transistor and extends from the second program transistor toward the second-oriented direction in the first direction, and
the fifth and sixth local interconnects are mutually connected through a contact.

14. The semiconductor storage device of claim 13, further comprising:
a first power supply line extending in the second direction and supplying a first power supply voltage,
wherein
the fifth and sixth local interconnects have overlaps with the first power supply line as viewed in plan, and either of the fifth and sixth local interconnects is connected with the first power supply line through a contact.

\* \* \* \* \*